(12) United States Patent
Koduri

(10) Patent No.: US 11,201,096 B2
(45) Date of Patent: Dec. 14, 2021

(54) PACKAGED DEVICE WITH DIE WRAPPED BY A SUBSTRATE

(71) Applicant: Texas Instruments Incorporated, Dallas, TX (US)

(72) Inventor: Sreenivasan K. Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/506,526

(22) Filed: Jul. 9, 2019

(65) Prior Publication Data

US 2021/0013116 A1 Jan. 14, 2021

(51) Int. Cl.
*H01L 23/31* (2006.01)
*H01L 23/00* (2006.01)
*H01L 23/48* (2006.01)
*B81C 1/00* (2006.01)
*B81B 3/00* (2006.01)
*B81B 7/00* (2006.01)

(52) U.S. Cl.
CPC ........ *H01L 23/3114* (2013.01); *B81B 3/0083* (2013.01); *B81B 7/0006* (2013.01); *B81B 7/0067* (2013.01); *B81B 7/0093* (2013.01); *B81C 1/00095* (2013.01); *B81C 1/00182* (2013.01); *B81C 1/00317* (2013.01); *H01L 23/481* (2013.01); *H01L 24/09* (2013.01); *B81B 2201/0264* (2013.01); *B81B 2201/0292* (2013.01)

(58) Field of Classification Search
CPC . H01L 23/3114; H01L 23/481; B81B 3/0083; B81B 7/0067; B81B 7/0093; B81C 1/0095; B81C 1/00095; B81C 1/00182; B81C 1/00317
See application file for complete search history.

(56) References Cited

U.S. PATENT DOCUMENTS

| 6,368,896 | B2 | 4/2002 | Farnworth et al. | |
| 6,514,793 | B2 | 2/2003 | Isaak | |
| 10,134,687 | B1* | 11/2018 | Kim | H01L 24/85 |
| 2003/0067064 | A1* | 4/2003 | Kim | H01L 25/105 257/686 |
| 2005/0056921 | A1* | 3/2005 | Wehrly, Jr. | H01L 25/105 257/686 |
| 2005/0095750 | A1* | 5/2005 | Lo | H01L 23/3171 438/114 |

(Continued)

*Primary Examiner* — Nathan W Ha
(74) *Attorney, Agent, or Firm* — Ronald O. Neerings; Charles A. Brill; Frank D. Cimino

(57) ABSTRACT

A die-wrapped packaged device includes at least one flexible substrate having a top side and a bottom side that has lead terminals, where the top side has outer positioned die bonding features coupled by traces to through-vias that couple through a thickness of the flexible substrate to the lead terminals. At least one die includes a substrate having a back side and a topside semiconductor surface including circuitry thereon having nodes coupled to bond pads. One of the sides of the die is mounted on the top side of the flexible circuit, and the flexible substrate has a sufficient length relative to the die so that the flexible substrate wraps to extend over at least two sidewalls of the die onto the top side of the flexible substrate so that the die bonding features contact the bond pads.

23 Claims, 22 Drawing Sheets

(56) References Cited

U.S. PATENT DOCUMENTS

| | | | |
|---|---|---|---|
| 2005/0161793 A1* | 7/2005 | Ohno | H01L 24/86 |
| | | | 257/686 |
| 2006/0049495 A1* | 3/2006 | Hazeyama | H01L 25/105 |
| | | | 257/678 |
| 2008/0169556 A1* | 7/2008 | Liu | H01L 23/3677 |
| | | | 257/706 |
| 2009/0146300 A1* | 6/2009 | Yang | H01L 23/3128 |
| | | | 257/738 |
| 2018/0068983 A1* | 3/2018 | Chang | H01L 21/6835 |
| 2018/0204870 A1* | 7/2018 | Momiuchi | H01L 27/14 |
| 2019/0074251 A1* | 3/2019 | Kang | H01L 23/3128 |
| 2019/0198411 A1* | 6/2019 | Horikawa | H01L 23/3128 |
| 2020/0098698 A1* | 3/2020 | Patten | H01L 23/3128 |
| 2020/0312781 A1* | 10/2020 | Signorini | H01L 21/4853 |

* cited by examiner

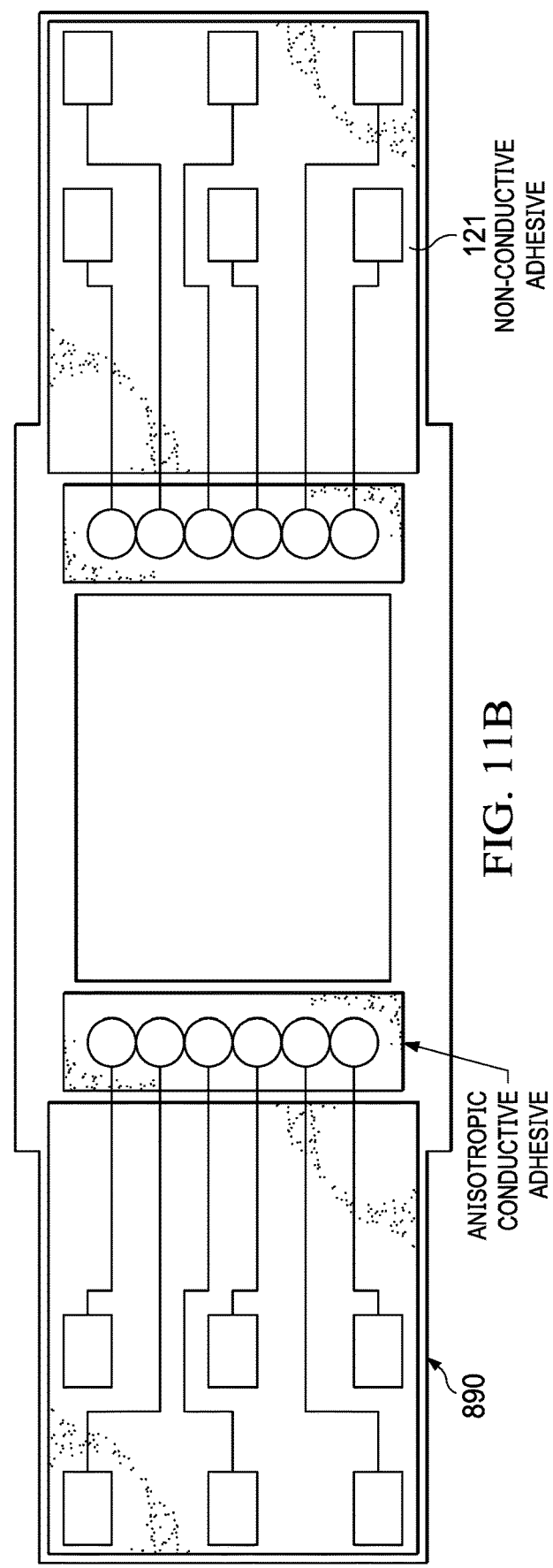

PACKAGED DEVICE WITH DIE WRAPPED BY A SUBSTRATE

FIELD

This Disclosure relates to chip scale-like semiconductor packages.

BACKGROUND

A wafer chip scale package or chip-scale package (CSP) is a type of integrated circuit package. The needed metal interconnect and dielectric layers are applied on top of a wafer using photolithographic techniques that fit well with wafer processing. These layers are typically thin, and a semiconductor die generally forms major portion of the package body. All the interconnects between the semiconductor die, the package, and the user's printed circuit board (PCB) are on the active side (top side) of the semiconductor die. The stresses from the PCB are transferred directly to the semiconductor die. These stresses can cause parametric shifts on the semiconductor die, as well as early packaged device failures while in the field.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes conventional wafer CSPs (WCSPs) have several shortcomings. These shortcomings include the semiconductor die being exposed can be a reliability risk due to mechanical and optical sensitivities. Passivation materials such as conventional polyamide layers can cause excessive stress to the die due to the high temperature cure and large volume of volatiles. Dielectric layers in the package may be too thin so that they may become permeable to moisture and light. Because the WCSP is built on top of the semiconductor die, choices of materials and sizes are limited. It is also difficult to create multiple metal/insulation layer combinations for complex routing, it is expensive to build, and needs major captive capital investment that generally cannot be used for anything else. One cannot generally create a land grid array (LGA)/quad flat pack no lead (QFN) type of footprint, and it is generally required that a single pin size be used for all pins (including both power and signal pins). Moreover, laminate-based embedding and build-up processes for WCSP are generally expensive, constraining and complex in manufacturing, and are generally an overkill for the most commonly needed miniature semiconductor device packages.

Disclosed aspects include a new chip scale-like package referred to herein as a "die-wrapped packaged device" with at least one die (a semiconductor die for semiconductor devices or an optical MEMS die for optical devices) that is wrapped by at least one flexible substrate, where the flexible substrate(s) at least partially (meaning herein on at least 3 sides) envelopes the die(s) and provides exposed lead terminals at least on the bottom surfaces of the lead terminals that enables connection to another substrate. In disclosed aspects, there is no need for additional encapsulation (molding) because the flexible substrate itself provides the encapsulation.

As used herein, a flexible substrate refers to a polymeric material having an elasticity (or Young's modulus) at 25° C. of 0.1 to 10 GPa, and a thickness of no more than 1 mm that together enable wrapping the substrate(s) which involves at least two 90° bends to envelop as noted above at least three sides of the die. The Young's modulus is a fundamental property of materials. For example, a polyamide generally has a 25° C. Young's modulus of about 2.5 GPa.

Disclosed die-wrapped packaged devices include at least one flexible substrate having a top side and a bottom side that has lead terminals, where the top side has outer positioned die bonding features coupled by traces to through-vias that couple through a thickness of the flexible substrate to the lead terminals. At least one die includes a substrate having a back side and a top side semiconductor surface including circuitry thereon having nodes coupled to bond pads. The term "bond pads" as used herein can also include conventional bond pads provided by a top metal layer, or pads provided by a redirect layer (RDL). One of the sides of the die is mounted on the top side of the flexible circuit, and wherein the flexible substrate has a sufficient length relative to the die so that the flexible substrate wraps to extend over at least two sidewalls of the die onto the top side of the flexible substrate so that the die bonding features contact the bond pads.

The flexible substrate thus has outer positioned die bonding features that are located so that after wrapping the die(s) they match the positions of the bond pads on the die. The die bonding features are connected by electrically conductive (typically metal) traces on the top side of the flexible substrate to through-vias (typically microvias) that connect to the lead terminals on bottom side of the flexible substrate. There is thus no wirebonding needed.

Disclosed aspects also include a related MEMS package in which a flexible substrate again at least partially envelops at least one MEMS optical die. By wrapping the MEMS die(s) with the flexible substrate(s), a disclosed MEMS package can be built in a reduced number of steps compared to conventional assembly for forming a MEMS package.

BRIEF DESCRIPTION OF THE DRAWINGS

Reference will now be made to the accompanying drawings, which are not necessarily drawn to scale, wherein:

FIG. 2A shows a top side of an example flexible substrate, FIG. 2B shows a die after being placed with its back side down on the flexible substrate, FIG. 2C shows an example die-wrapped package device where the flexible substrate has one side wrapped around a sidewall of the die to extend onto the top side of the die with the other side not shown wrapped only to reveal features on the flexible substrate and on the top side of the die, and FIG. 2D shows a perspective bottom view (on top of FIG. 2D) and a perspective transparent top view (on the bottom of FIG. 2D) of the die-wrapped device shown in FIG. 2C now having the other side wrapped.

FIG. 3A shows a simple depiction of the three piston die wrapping apparatus, FIG. 3B depicts the flexible substrate placed with pre-applied adhesive onto the pistons, FIG. 3C shows the result after placing the die face up on the flexible substrate, FIG. 3D shows the result after pushing the die and flexible substrate down into a recessed cavity area 311, FIG. 3E shows the result after pulling the side pistons inwards to complete wrapping, and FIG. 3F shows the result after ejecting the finished die-wrapped packaged device.

FIG. 4A shows a die wrapped by two flexible substrates, FIG. 4B shows a die wrapped by flexible substrates after wrapping provided near 100% coverage of the die, FIG. 4C depicts the results after wrapping multiple units at a time and then singulating along the cutline shown, FIG. 4D shows a top perspective view of a partially wrapped die arrangement, and FIG. 4E depicts the result after wrapping the die from all four sides with multiple flexible substrates.

FIG. 5A shows the bottom side of the flexible substrate includes the lead terminals shown as package pins for external connections, and FIG. 5B shows on top of each of the lead terminals is package pins or metal balls to provide a ball grid array (BGA).

FIGS. 6A-D show some other alternate arrangements where the die-wrapped packaged device provides die protection, interconnect, fan-out, and pins. FIG. 6A and FIG. 6B show examples of a flexible substrate wrap-up, and FIG. 6C and FIG. 6D each show examples of a flexible substrate wrap-down.

FIG. 11B shows a bottom side view of the flexible substrate.

FIG. 15A shows an example optical MEMS package extended to sensors such as humidity and pressure sensors by exposing a portion of the surface of the die to the environment while still enabling interconnects and pinount, while FIG. 15B shows the package in FIG. 15A having multiple die, while

DETAILED DESCRIPTION

Figure 1:
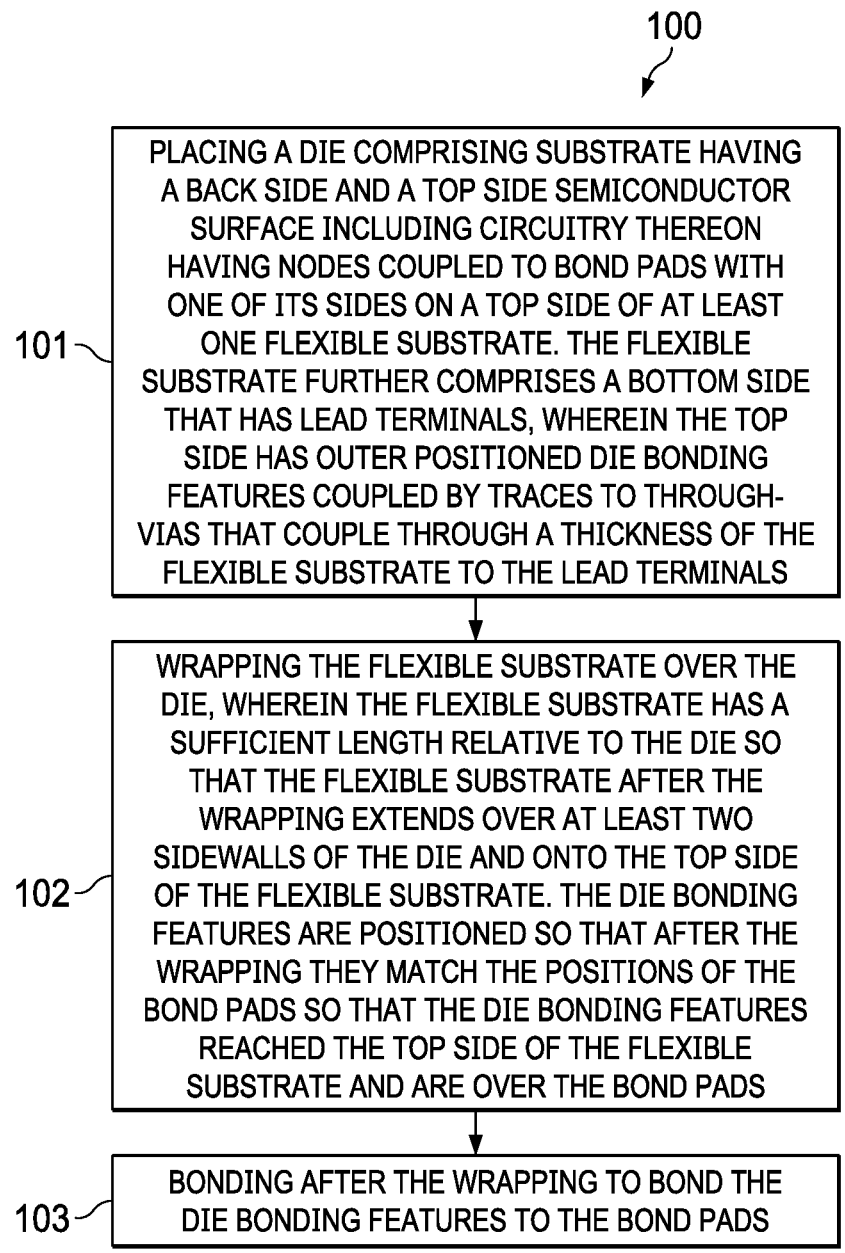
FIG. 1 is a flow chart that shows steps in an example method for forming a die-wrapped packaged device with a semiconductor die that has at least three sides wrapped by at least one flexible substrate, where the flexible substrate(s) at least partially envelopes the die and provides exposed lead terminals, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1 is a flow chart that shows steps in an example method 100 for forming a die-wrapped packaged device with a semiconductor die that has at least three sides wrapped by at least one flexible substrate, where the flexible substrate(s) thus at least partially envelopes the die and provides exposed lead terminals. The method 100 includes step 101 comprising placing a die comprising substrate having a back side and a topside semiconductor surface including circuitry thereon having nodes coupled to bond pads with its one of its sides on a top side of at least one flexible substrate. The die can comprise a semiconductor die having circuitry configured for at least one function, or a MEMS die such as an optical MEMS die or a sensor die, or a passive device die. The flexible substrate further comprises a bottom side that has lead terminals, wherein the top side has outer positioned die bonding features coupled by traces to through-vias that couple through a thickness of the flexible substrate to the lead terminals.

The die bonding features can comprise an anisotropic electrically conductive paste, solder bumps, copper pillars, an electrically conductive epoxy, or a metal polymer composite. The flexible substrate can comprise a polymer, a glass-reinforced epoxy laminate material, a paper, or a dielectric metal comprising foil.

Step 102 comprises wrapping the flexible substrate over the die, wherein the flexible substrate has a sufficient length relative to the die so that the flexible substrate after the wrapping extends over at least two sidewalls of the die and onto the top side of the flexible substrate. The die bonding features are positioned so that after the wrapping they match the positions of the bond pads so that the die bonding features reached the top side of the flexible substrate and are over the bond pads. Step 103 comprises bonding after the wrapping to bond the die bonding features to the bond pads. The bonding step can comprise a bake or a reflow (such as at a temperature of 80° C. to 300° C.), an ultraviolet (UV) cure, be pressure activated, or be a combination of 2 or more of these treatments.

The flexible substrate can comprise a plurality of the flexible substrates, and the wrapping can comprise wrapping each of the flexible substrates over at least one of the two sidewalls of the die. The wrapping can comprise using a piston-like pushing apparatus (see FIGS. 3A-3D described below) that comprises a middle piston that moves vertically, and first and second side pistons that move horizontally. The die can comprise two or more stacked die bonded to one another, or can comprise multiple of the die positioned side-by-side, with these various arrangements shown in FIGs. described below.

Figure 2A:
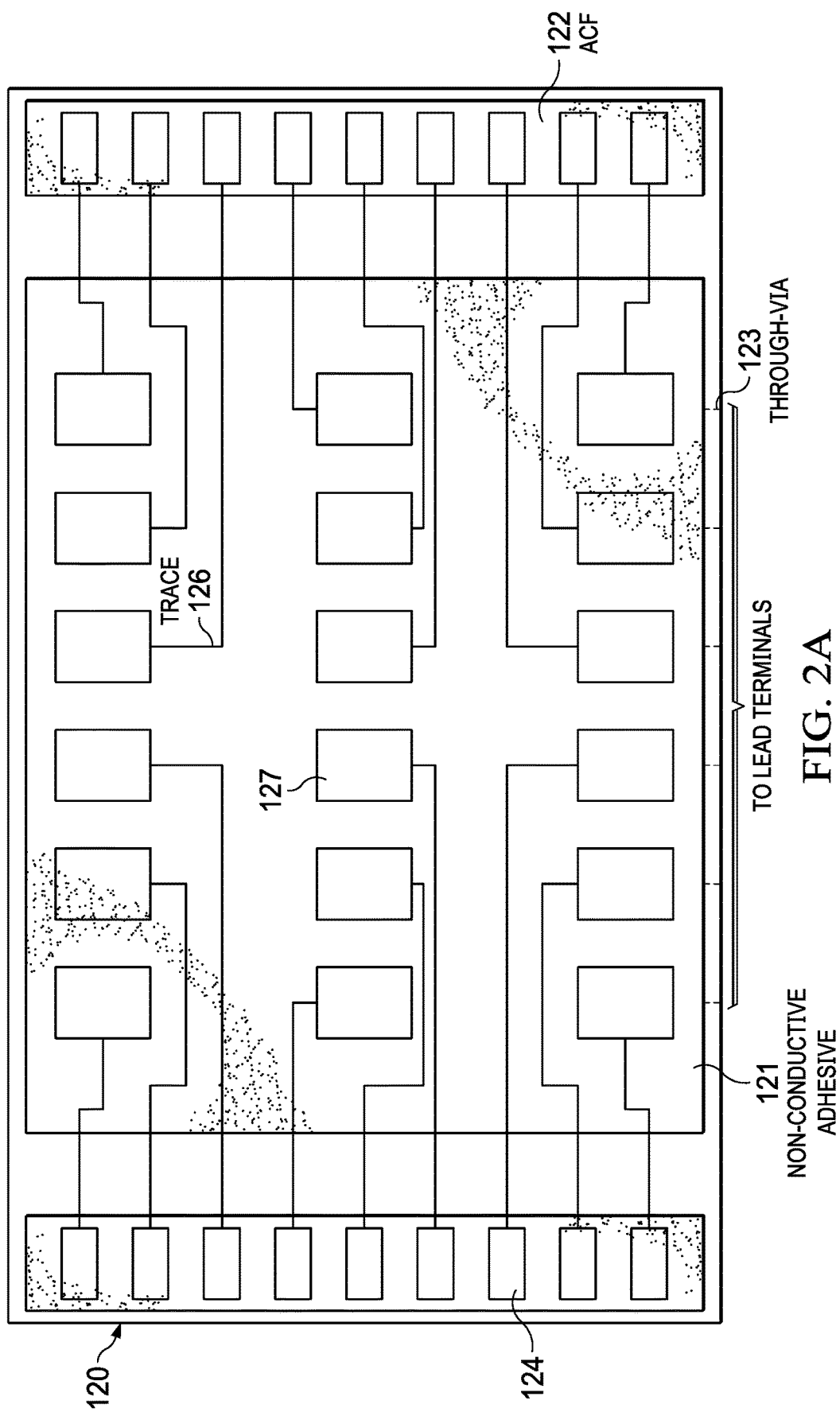
FIGS. 2A-2D provide successive view that shows the in-process structures corresponding to steps in a disclosed method for forming a die-wrapped packaged device comprising a semiconductor die that is wrapped on at least three sides by at least one flexible substrate, according to an example aspect.

FIGS. 2A-2D provide successive view that shows the in-process structures corresponding to steps in a disclosed method for forming a die-wrapped packaged device comprising a semiconductor die 180 that is wrapped on at least three sides by at least one flexible substrate 120, according to an example aspect. On the top side of the flexible substrate 120 shown in FIG. 2A is a portion having a non-conductive adhesive 121, and on the outer left and outer right side are die bonding features 124 on an anisotropic conductive film or an anisotropic conductive paste (hereafter ACF) 122 that provides electrical conductivity only the z-direction (into the page). The adhesives 121 and 122 are each represented by groups of dots shown in their upper left and lower right corners.

The non-conductive adhesive 121 is for holding the flex substrate 120 to the die 180 after wrapping. The non-conductive adhesive 121 can comprise a dielectric polymer such as an epoxy resin or silicone. An electrical and mechanical contact is made between the die bonding features 124 such as contact pads and bond pads 181 with an electrically conductive adhesive or solder. The bonding features 124 are shown coupled by traces 126 to pads 127 generally comprising metal pads that are coupled to through-vias 123, where the through-vias 123 couple through a thickness of the flexible substrate 120 to lead terminals on the bottom side of the flexible substrate 120, with the lead terminals as shown in FIG. 2D as 129. The flexible substrate 120 can be a single or multilayer design that has its bonding features positioned to match the position of bond pads on a die to be wrapped by the flexible substrate 120.

Figure 2B:
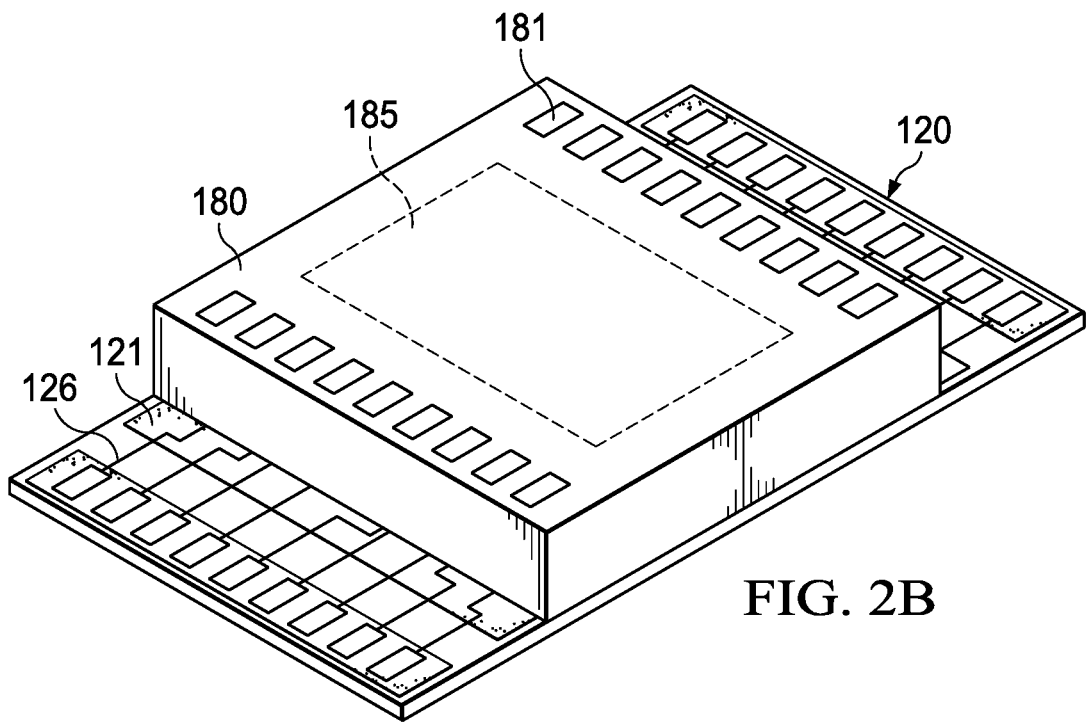
Figure 2C:
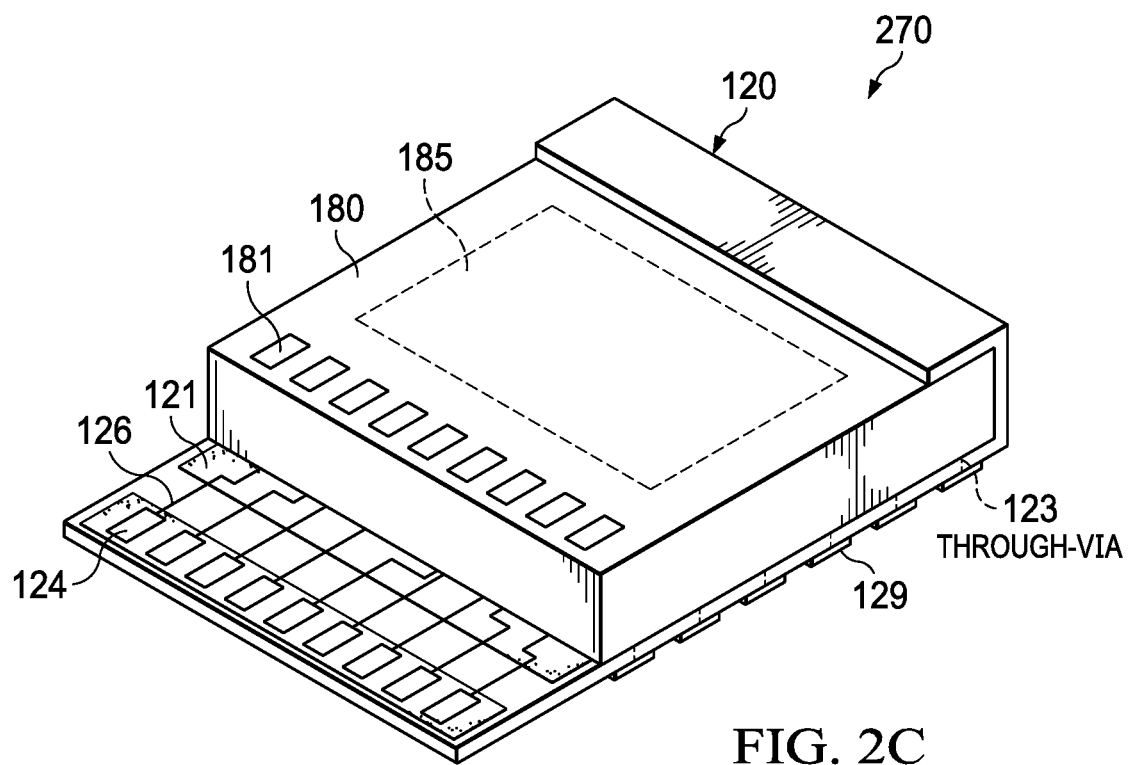
Figure 2D:
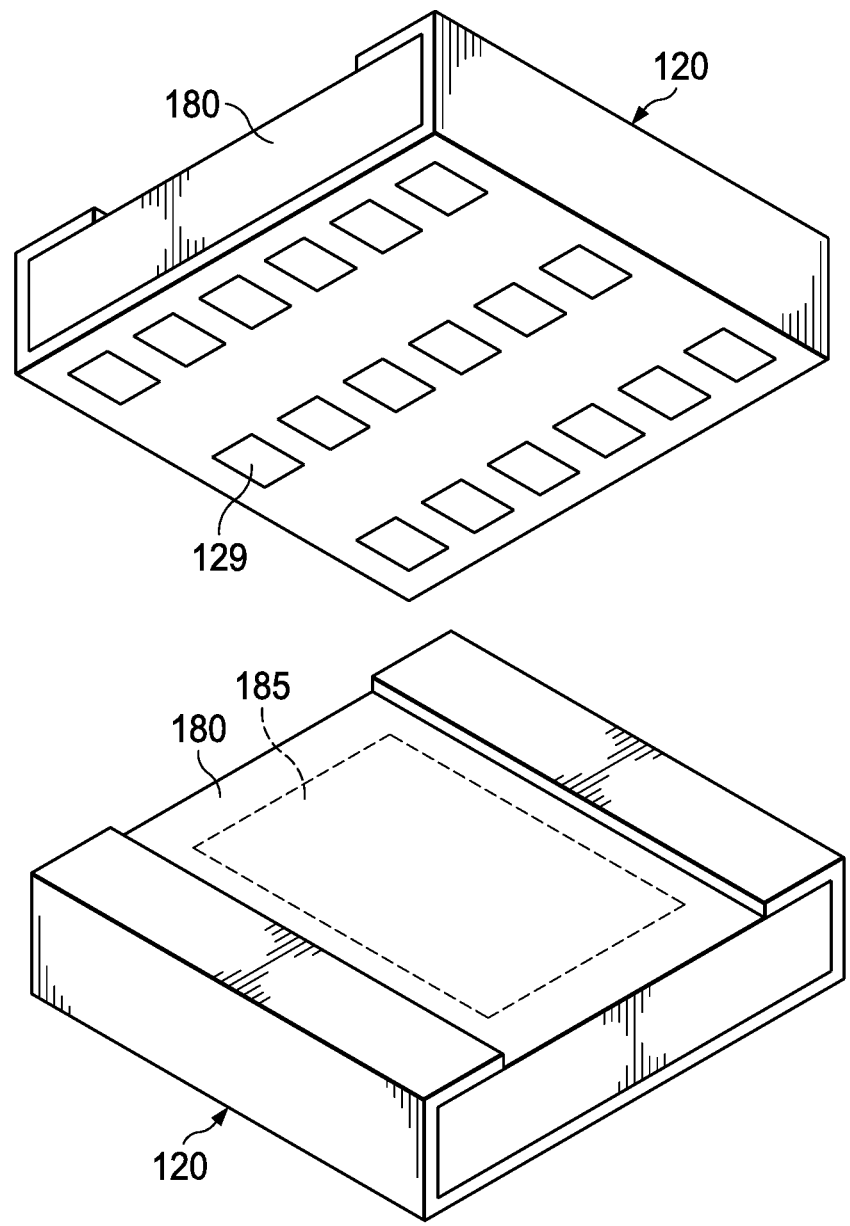

FIG. 2B shows a die 180 after being placed with its back side down on the flexible substrate 120 to have its bond pads 181 on his top side facing up. However, the die can also be flipchip placed on the flexible substrate 120. In case of flip chip, the interconnect pads on the die can be further enhanced with solder balls, copper posts, or conductive polymer balls. A pick and place apparatus can be used for this purpose. The die 180 is shown including circuitry 185 represented by a dashed rectangle that has respective nodes coupled to the bond pads 181. FIG. 2C shows an example die-wrapped package device 270 where the flexible substrate has one side wrapped around a sidewall of the die to extend onto the top side of the die 180 with the other side not shown wrapped only to reveal features on the flexible substrate and on the top side of the die 180, and FIG. 2D shows a perspective bottom view (on top of FIG. 2D) and a perspective transparent top view (on the bottom of FIG. 2D) of the die-wrapped device 270 shown in FIG. 2C now having the other side wrapped.

Figure 3A:
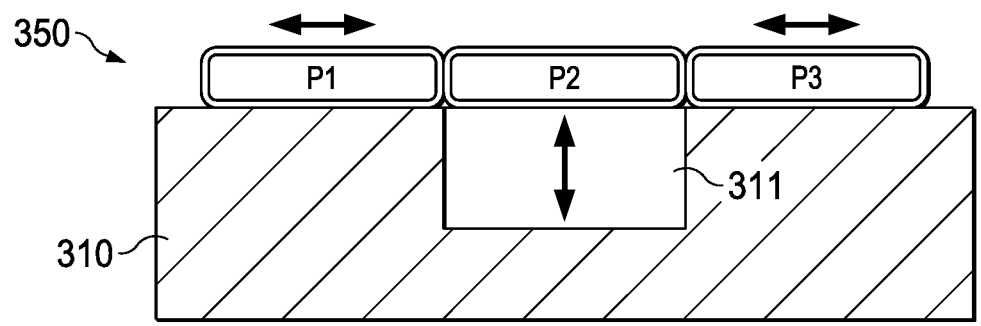
FIGS. 3A-3F show an example manufacturing flow for flexible substrate wrapping of a die.
Figure 3B:
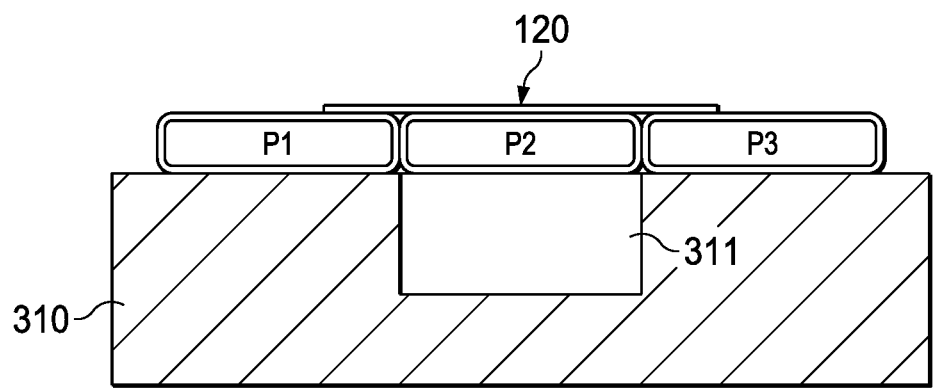
Figure 3C:
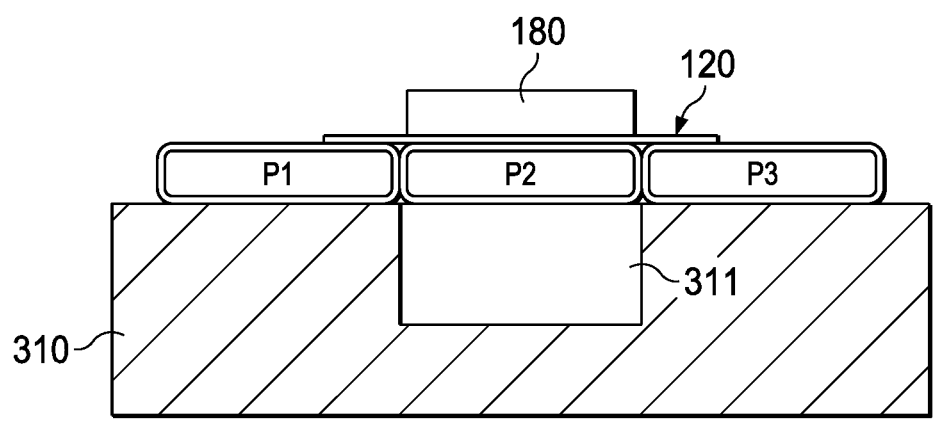
Figure 3D:
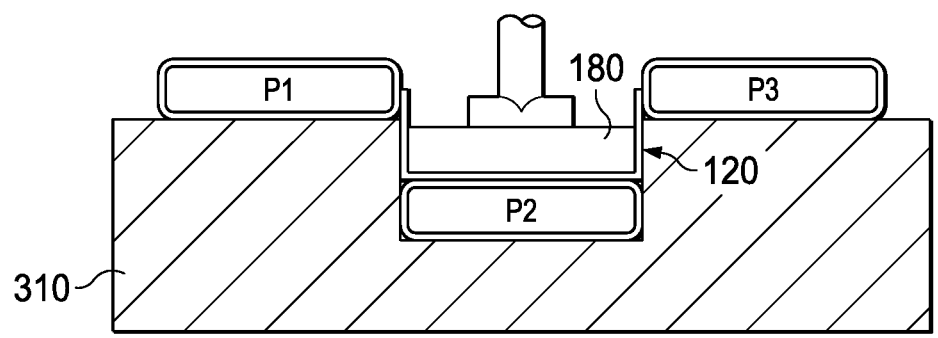
Figure 3E:
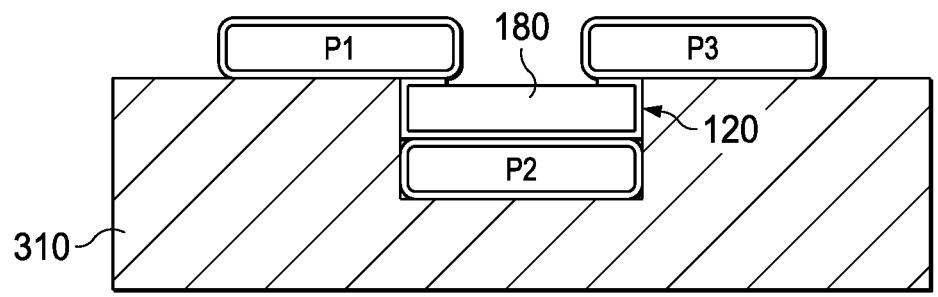
Figure 3F:
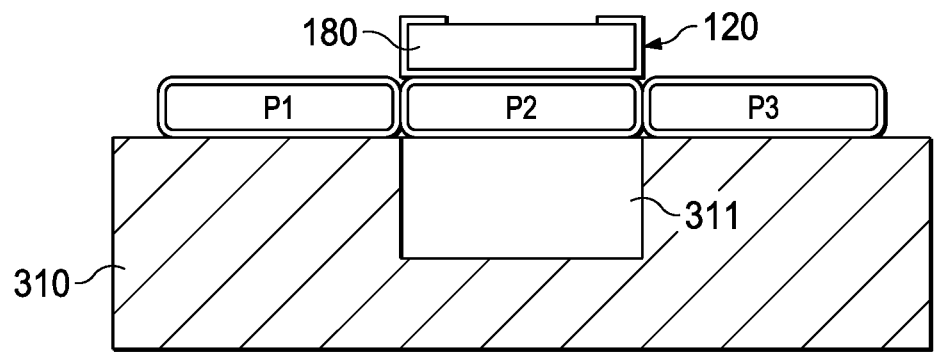

FIG. 3A-3F show an example manufacturing flow for assembling a flexible substrate by wrapping of a die using a piston-like wrapping apparatus 350 that includes a platform 310 having a recessed cavity area 311, and three pistons shown as P1, P2 and P3. FIG. 3A shows a simplified depiction of the three piston die wrapping apparatus 350. The middle piston P2 moves vertically, and the side pistons P1 and P3 move horizontally. FIG. 3B shows the flexible substrate 120 placed with pre-applied adhesive onto the pistons. FIG. 3C shows the result after placing the die 180 face up on the flexible substrate 120. FIG. 3D shows the result after pushing the die 180 and flexible substrate 120 down into the recessed cavity area 311. FIG. 3E shows the result after pulling the side pistons P1 and P3 inwards to complete wrapping. FIG. 3F shows the result after ejecting the finished die-wrapped packaged device. As disclosed above, an ACF having electrical conductivity only in the z-direction (but not in any lateral direction) can be used under the bonding features 124 to make electrical contact on the flexible substrate 120 to the bond pads 181 on the die 180. As noted above the non-conductive adhesive 121 holds the flex substrate 120 around the die 180.

The size of the flexible substrate 120 can be adjusted to provide a desired coverage around the die 180, being 100% if desired or only partial die 180 top side coverage. Pistons and walls of the cavity area 311 can be controlled to adjust to various die 180 and package sizes. For the operations shown in FIG. 3D and FIG. 3E, adhesives including the non-conductive adhesive 121 can be activated by increasing the temperature.

Figure 4A:
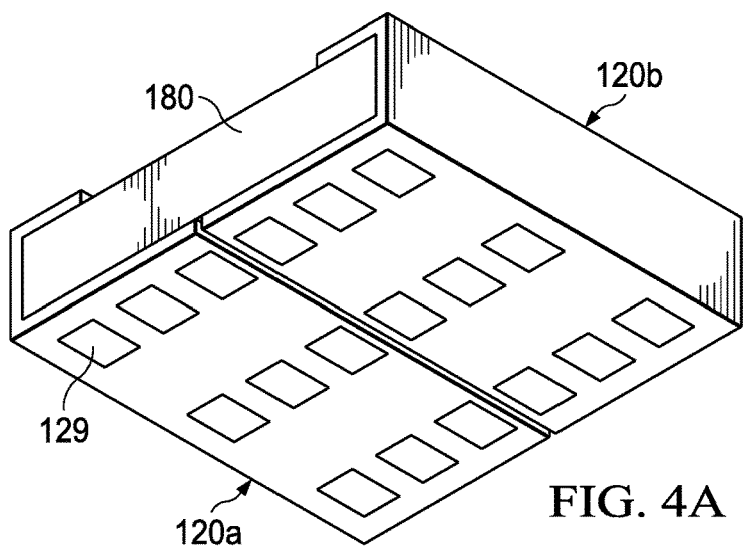
FIGS. 4A-E show some alternate arrangements including wrapping a die from two or four sides with multiple flexible substrates.
Figure 4B:
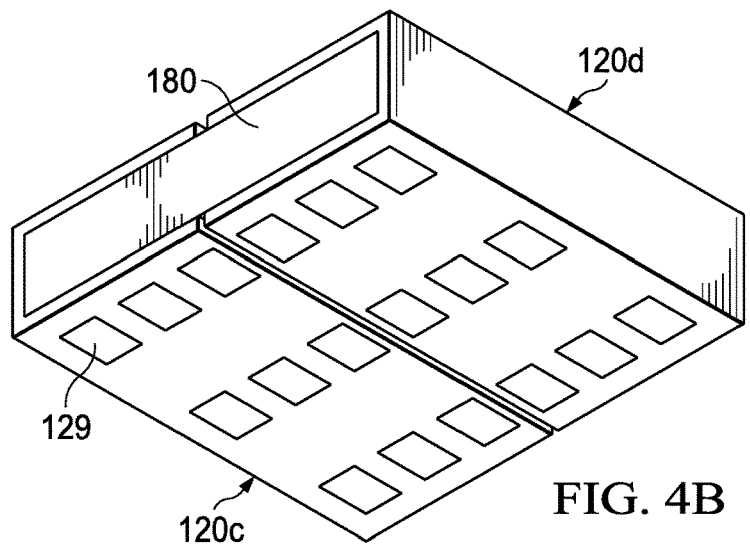
Figure 4D:
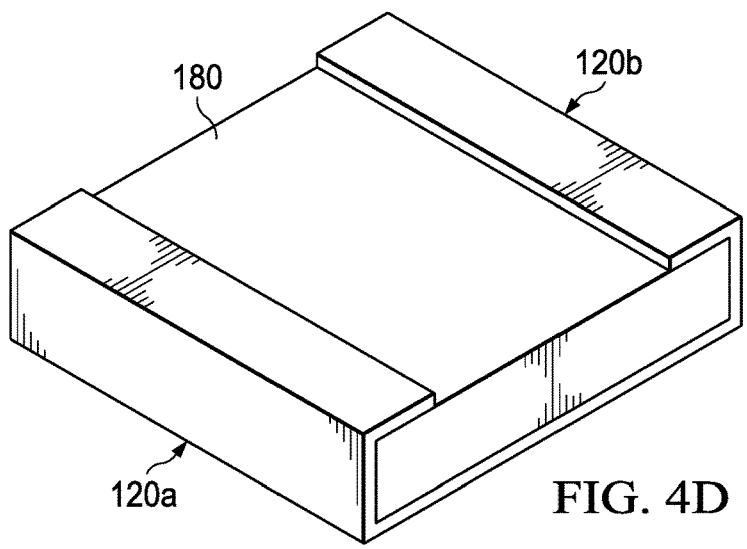
Figure 4C:
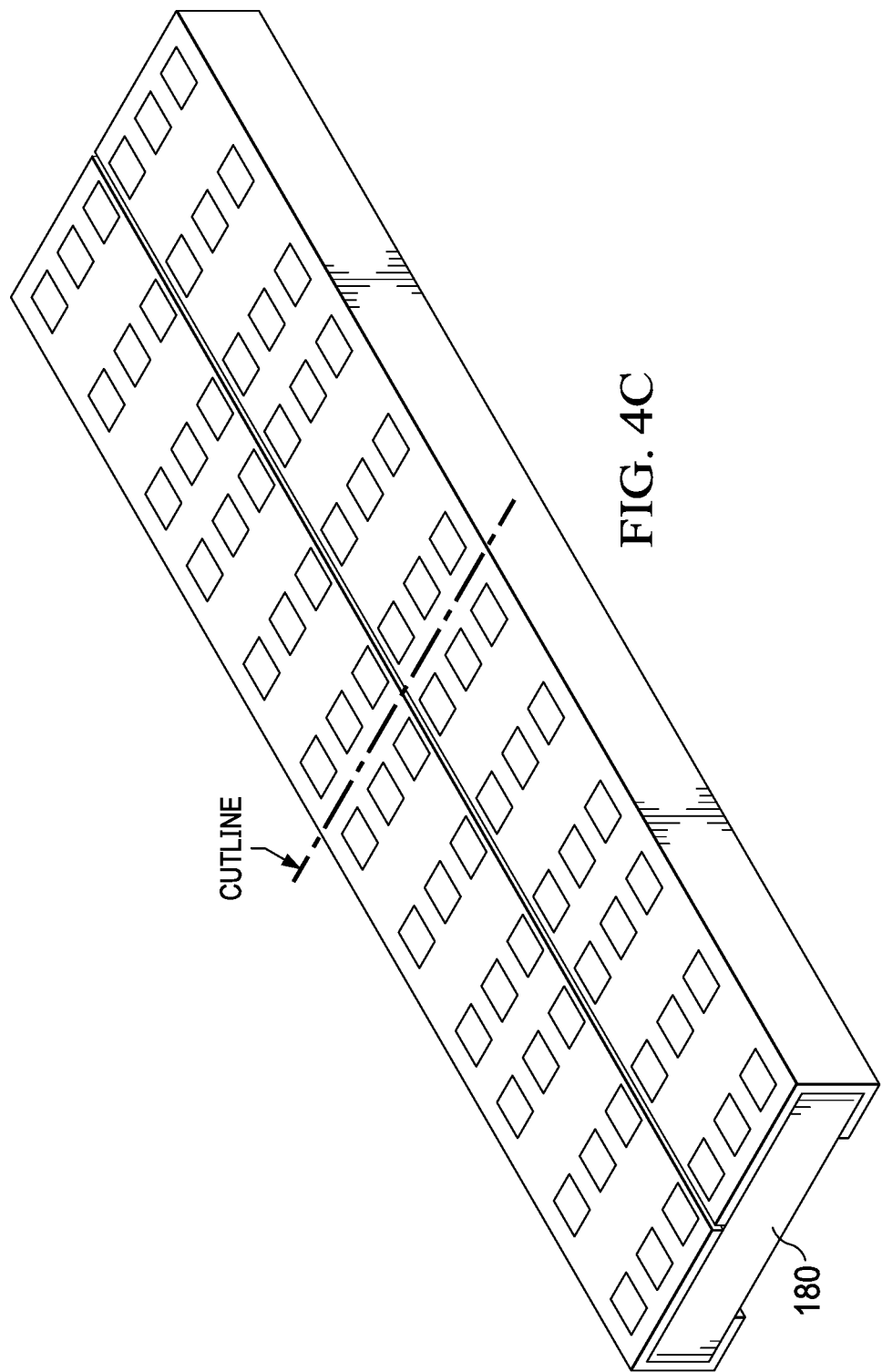
Figure 4E:
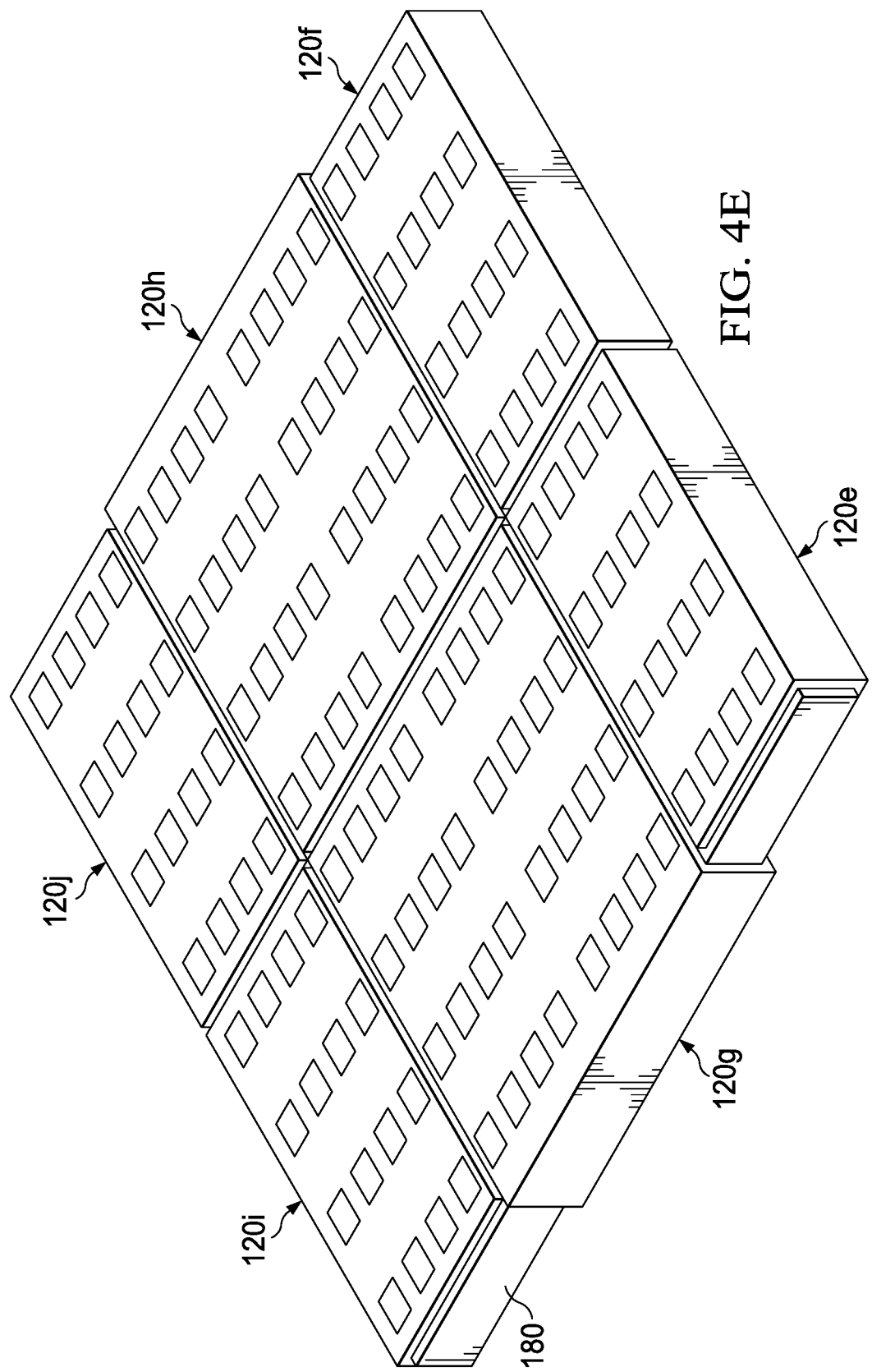

FIGS. 4A-E show some alternate arrangements including wrapping a die 180 from two or more sides with multiple flexible substrates. FIG. 4A shows a die 180 wrapped by two flexible substrates shown as 120a and 120b. FIG. 4B shows a die 180 wrapped by flexible substrates shown as 120c and 120d after wrapping provided near 100% coverage of the die 180 This FIG. evidences essentially the whole area of the die 180 can be used for contact points, so that there is thus no need to limit to contact along the periphery of the die 180. FIG. 4C shows the results after wrapping multiple units at a time and then singulating along the cutline shown. FIG. 4D again a top perspective view depiction of a partially wrapped arrangement. The exposed area of the die 180 can be left open to provide a stress-free zone. FIG. 4E depicts the result after wrapping the die 180 from all four sides with multiple flexible substrates shown as 120e, 120f, 120g, 120h, 120i and 120j. Using multiple flexible substrates can improve the flexibility as compared to a single flexible substrate.

Figure 5A:
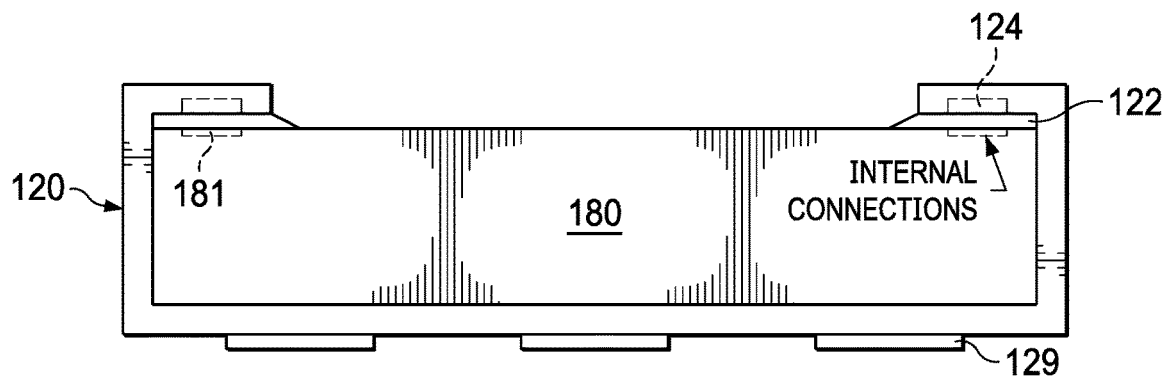
FIGS. 5A-B show some other alternate arrangements.
Figure 5B:
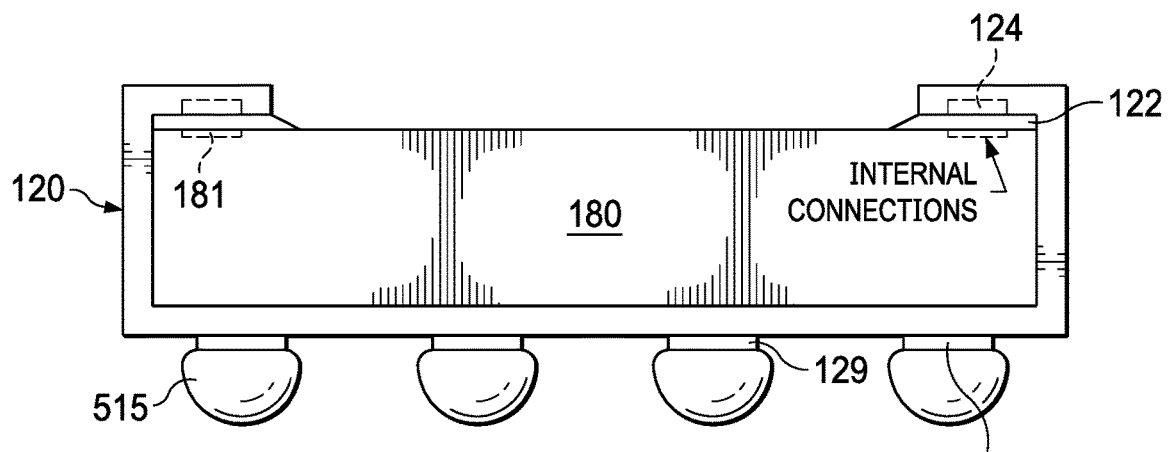

FIGS. 5A-B show some other alternate arrangements. As shown in FIG. 5A the bottom side of the flexible substrate 120 includes the lead terminals 129 shown as package pins for external connections. This arrangement provides a land grid array or a QFN-like foot print package. As shown in FIG. 5B on top of each of the lead terminals 129 is package pins or metal balls 515 to provide a BGA.

Figure 6A:
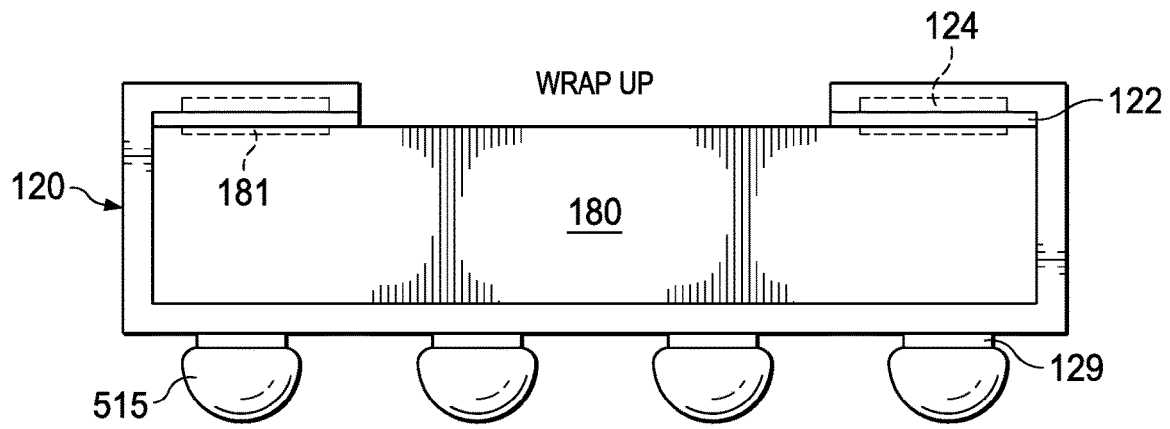
FIGS. 6A-D show some other alternate arrangements.
Figure 6B:
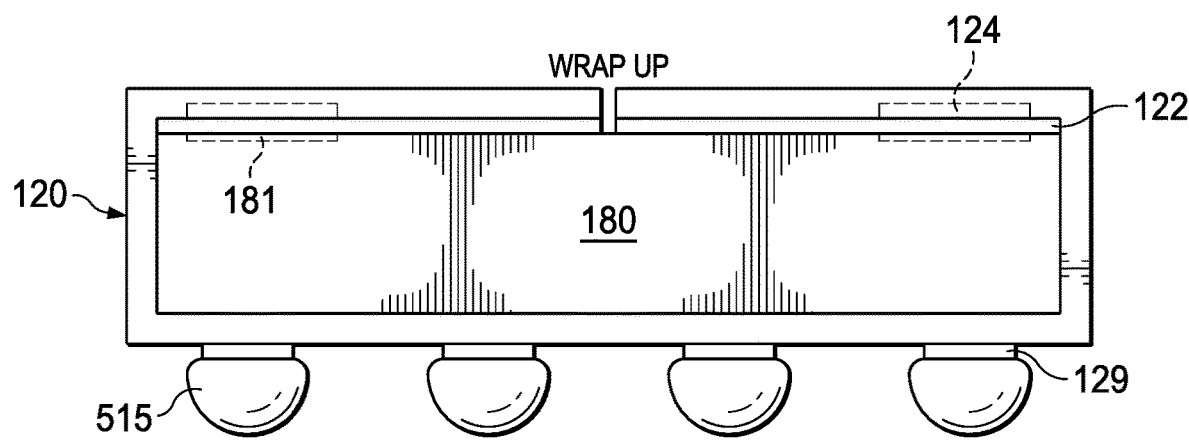
Figure 6C:
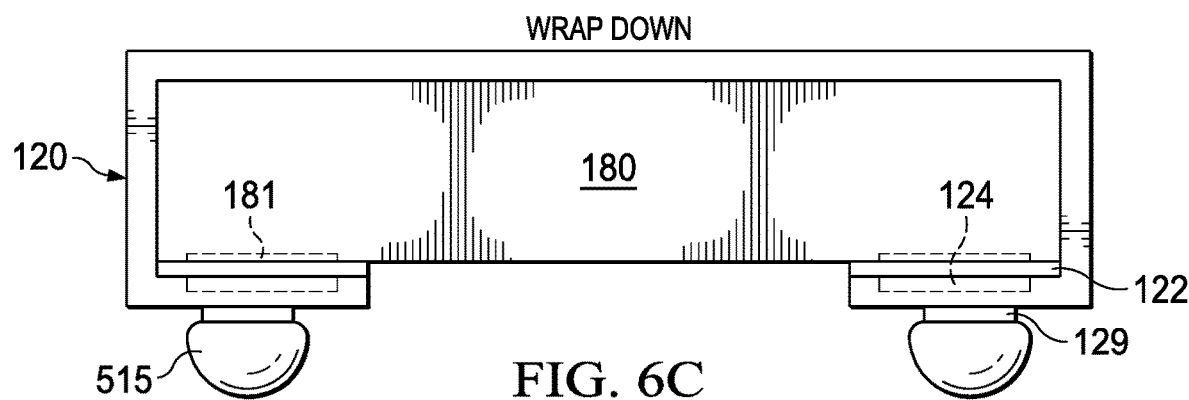
Figure 6D:
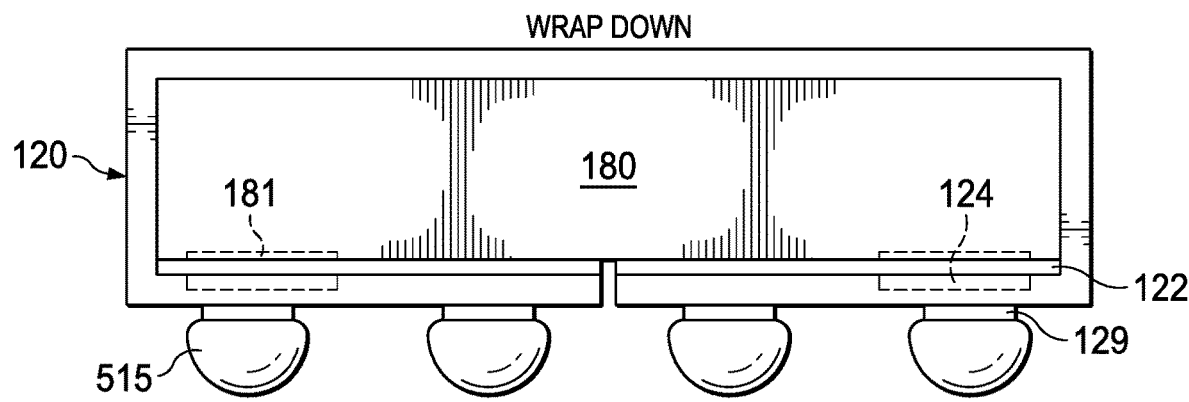

FIGS. 6A-D show some other alternate arrangements where the die-wrapped packaged device provides die protection, interconnect, fan-out, and pins. FIG. 6A and FIG. 6B show examples of a flexible substrate 120 wrap-up. FIG. 6C and FIG. 6D each show examples of a flexible substrate 120 wrap-down.

Figure 7A:
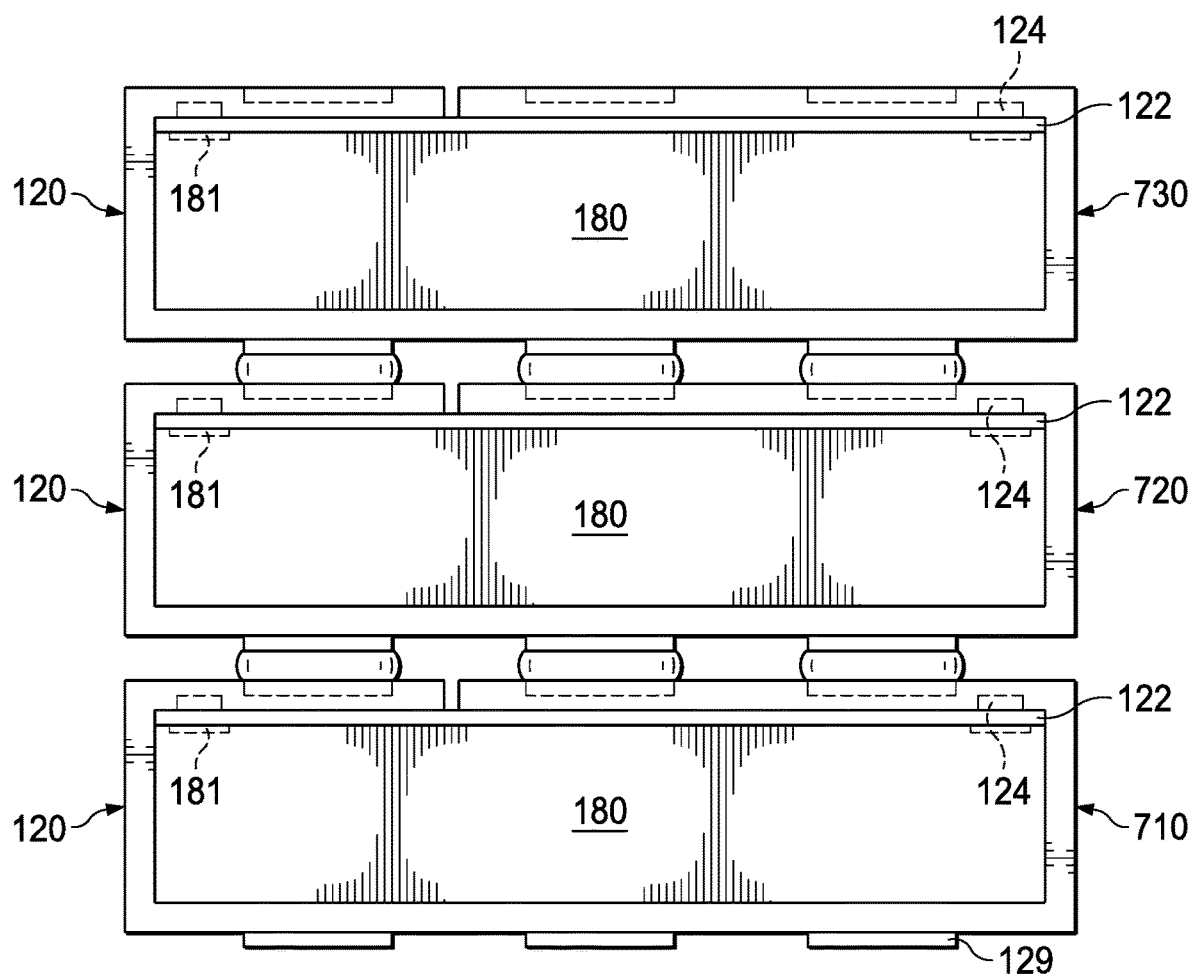
FIGS. 7A-B show yet some other alternate three die-wrapped packaged device arrangements.
Figure 7B:
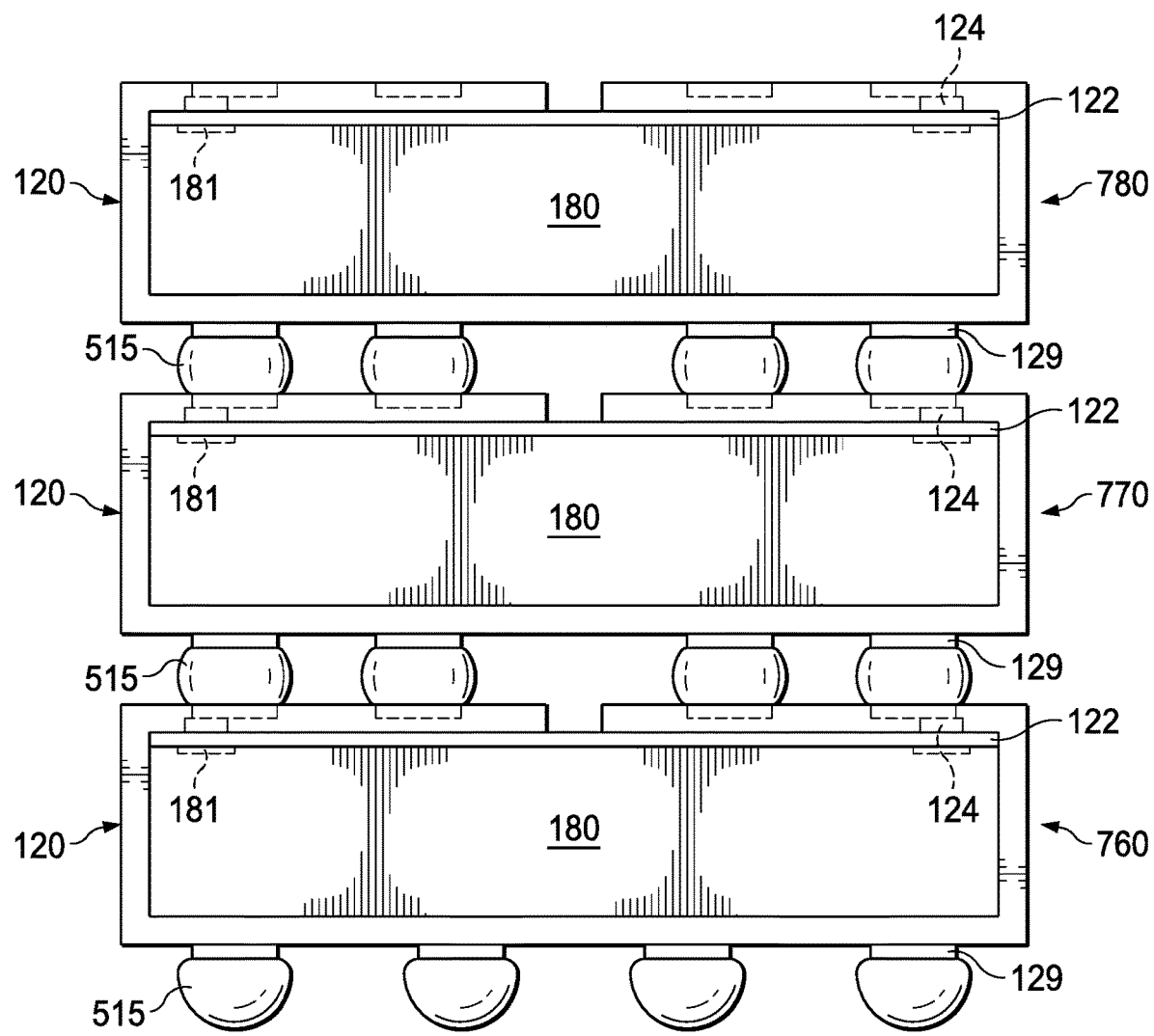

FIGS. 7A-B shows yet some other alternate arrangements shown as three die-wrapped packaged devices shown in FIG. 7A as 710, 720, 730 stacked on one another, with die-wrapped packaged device 730 being on the top, die-wrapped packaged device 720 being in the middle, and die-wrapped packaged device 710 being on the bottom. In FIG. 7B the die-wrapped packaged devices are shown as 760, 770, and 780 again stacked on one another with die-wrapped packaged device 780 being on the top, die-wrapped packaged device 770 being in the middle, and die-wrapped packaged device 760 being on the bottom.

Figure 8A:
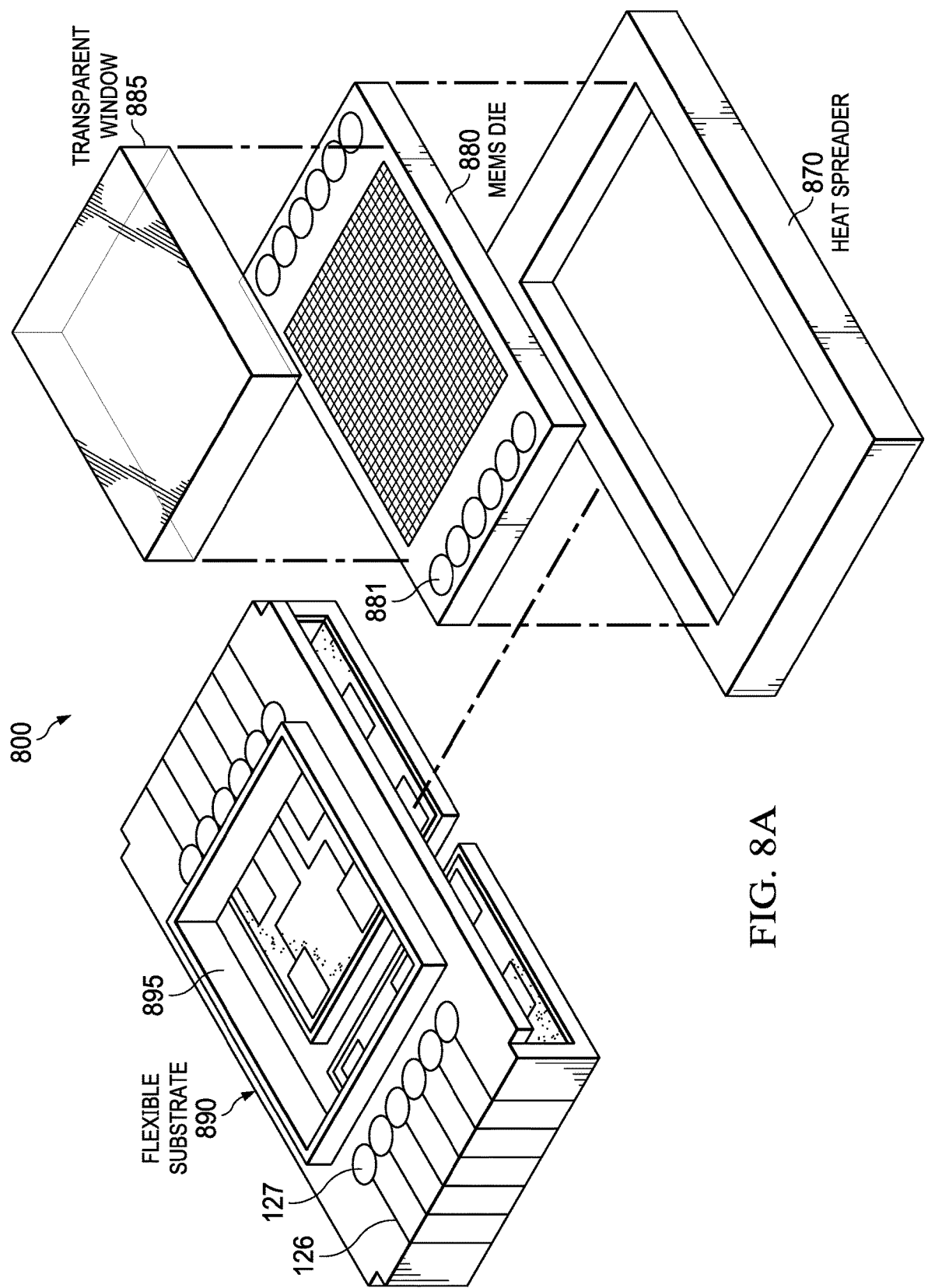
FIG. 8A is an exploded view of an example optical MEMS device that comprises a digital micro mirror (DMD) die and a flexible substrate that wraps the DMD die.
Figure 8B:
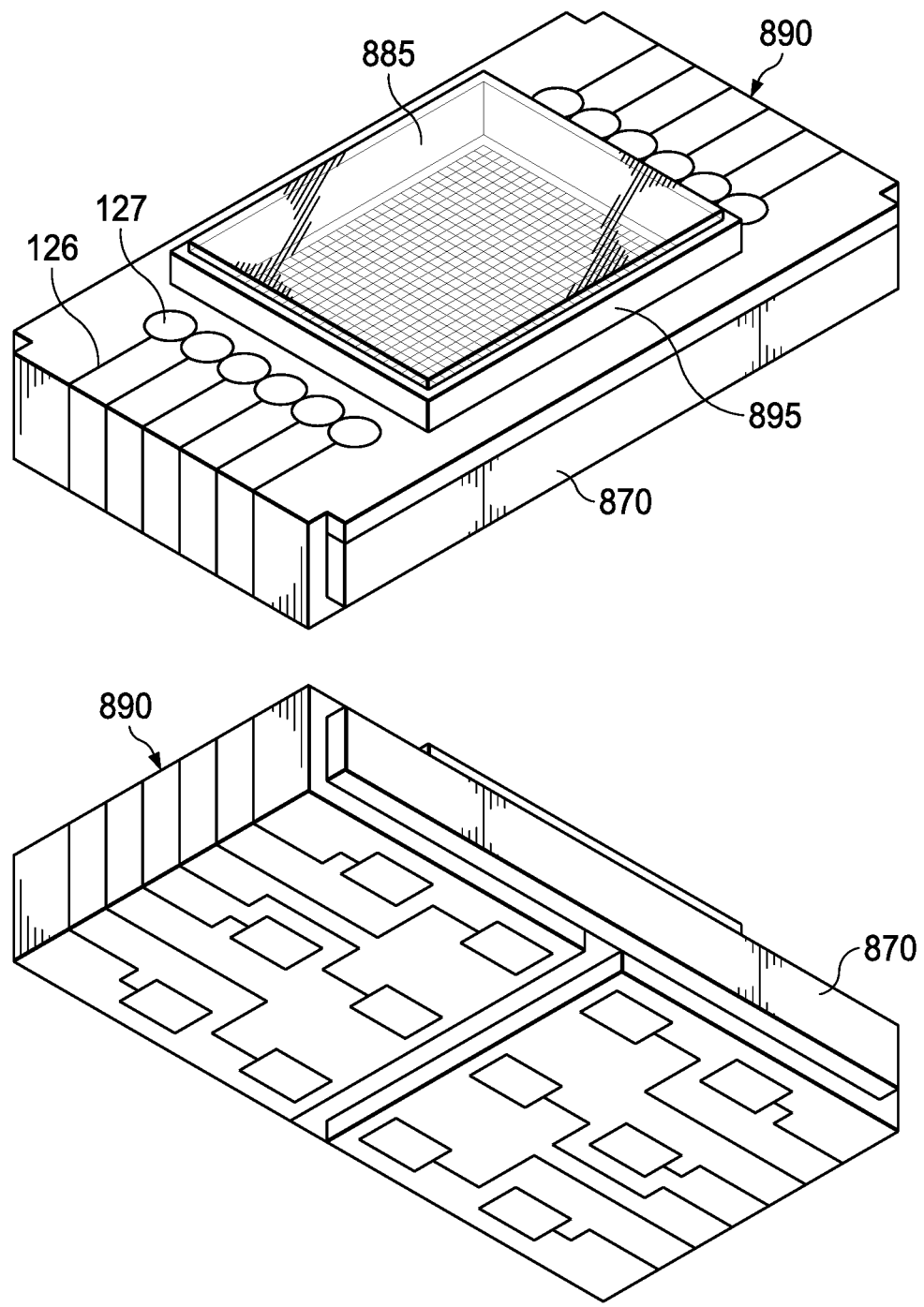
FIG. 8B is a depiction of an example optical MEMS device that comprises a DMD die and a flexible substrate that wraps the DMD die.

FIG. 8A is an exploded view of an example optical MEMS device 800 that comprises an optical MEMS die 880, a flexible substrate 890 having a center aperture that wraps the optical MEMS die 880 having bond pads 881, a metal heat spreader 870 and an optically transparent window 885 (e.g., a glass window) over the optical MEMS die 880 but not over the bond pads 881. As in the arrangements described above the flexible substrate 890 wraps the optical MEMS die 880. An optically opaque collar 895 is around the transparent window 885 to prevent stray light from entering the optical MEMS die 880. FIG. 8B is a top side perspective view depiction and a bottom side perspective view depiction of the example optical MEMS device 800 shown in FIG. 8A.

Non-conductive adhesive 121 and interconnect materials (traces 126, pads 127 and bonding features 124) can be pre-deposited on the flexible substrate 890. Conventional die-attach, wire-bond, and mold processes are replaced with a single step of wrapping the flexible substrate 890 to create an LGA/QFN type of package footprint. The photolithographic processes are migrated from the package assembly to substrate manufacturing, where it can be performed on a much larger scale at lower cost. This also allows for a much wider choice of materials to use, such as polymer layers, KAPTON tapes, and metal foils. Disclosed MEMS packages can be used in personal electronics as well as for industrial and automotive applications. One example application is for a pico projector.

Electrical contacts are made between pads (or bumps) on the die 880 to the flexible substrate 890 using ACF or micro bumps, or Cu posts, or conductive epoxy, or other features. A non-conductive adhesive described above shown as 121 above on the flexible substrate 890 can be used to hold the flexible substrate 890 wrapped around permanently to the package. The flexible substrate 890 can also wrap around a glass interposer, such as shown in FIG. 9 as was interposer 920 to provide an additional layer of hermeticity seal by reducing moisture ingress.

Figure 9:
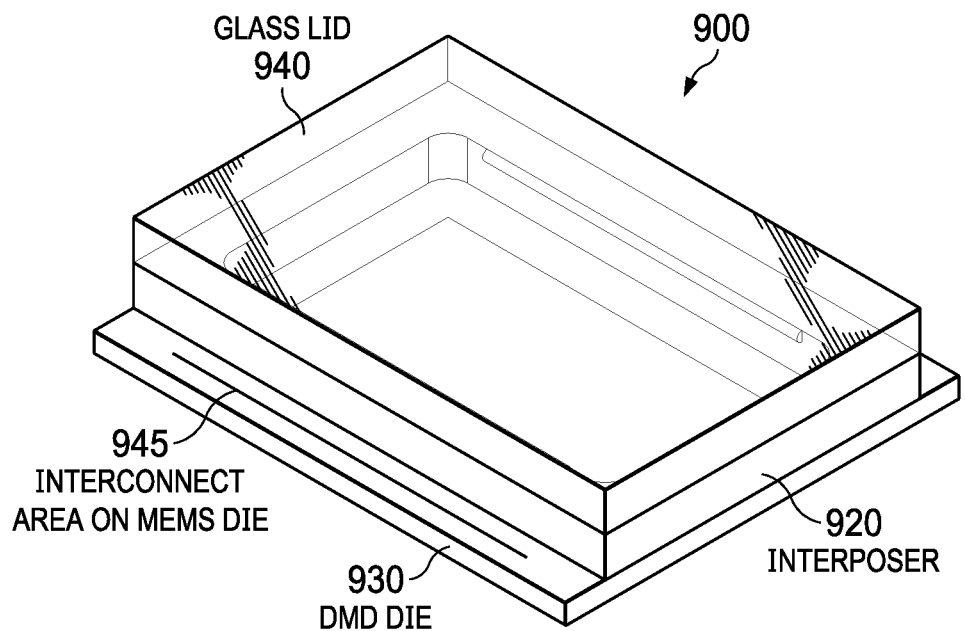
FIG. 9 shows steps in an example optical MEMS die construction.

FIG. 9 shows an example wrapped optical MEMS package 900. A glass lid 940 singulated from a glass wafer and a glass interposer 920 singulated from a glass interposer wafer are shown attached to a DMD die 930 singulated from a DMD wafer. Saw singulation cuts the glass lid 940 to expose a portion of the DMD die 930 outside the mirrors for interconnects as shown in FIG. 9. This ensures the interconnect area 945 is large enough for substrate connections later in the assembly process.

Figure 10:
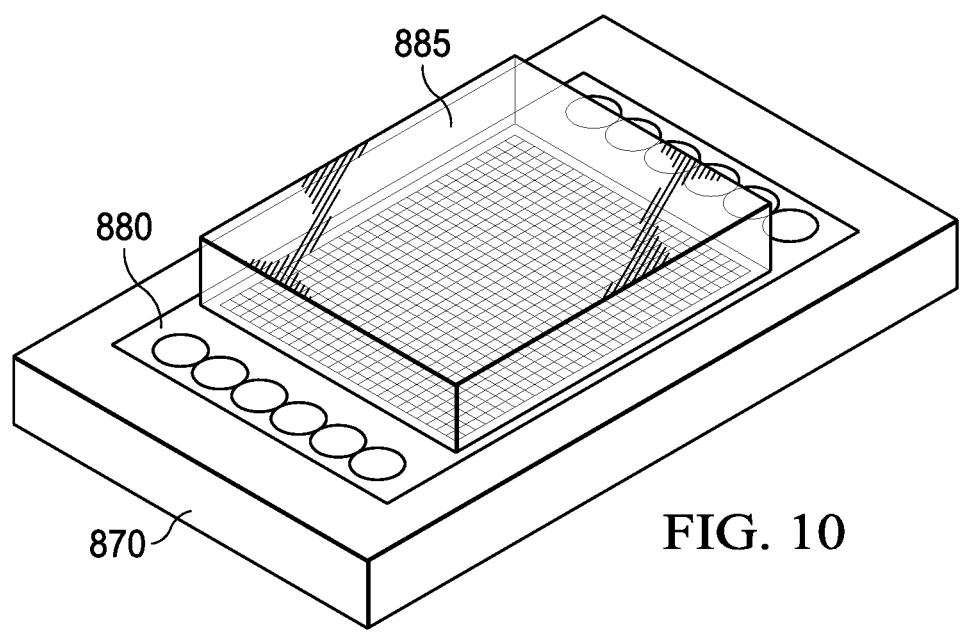
FIG. 10 shows an example heat sink, and the heat sink together with an optical MEMS die and a transparent window.

FIG. 10 shows an example heat spreader also called a heatsink 870, and the heatsink together with an optical MEMS die 880 and a transparent window 885. The heatsink 870 can comprise a metal or a rigid plastic that generally has high thermal conductivity and retain flatness over temperature. The MEMS die 880 (with sealed transparent window 885) can be attached to the heatsink 870 using a thermal adhesive, such as die-attach paste. The heatsink 870 also forms the package body.

Figure 11A:
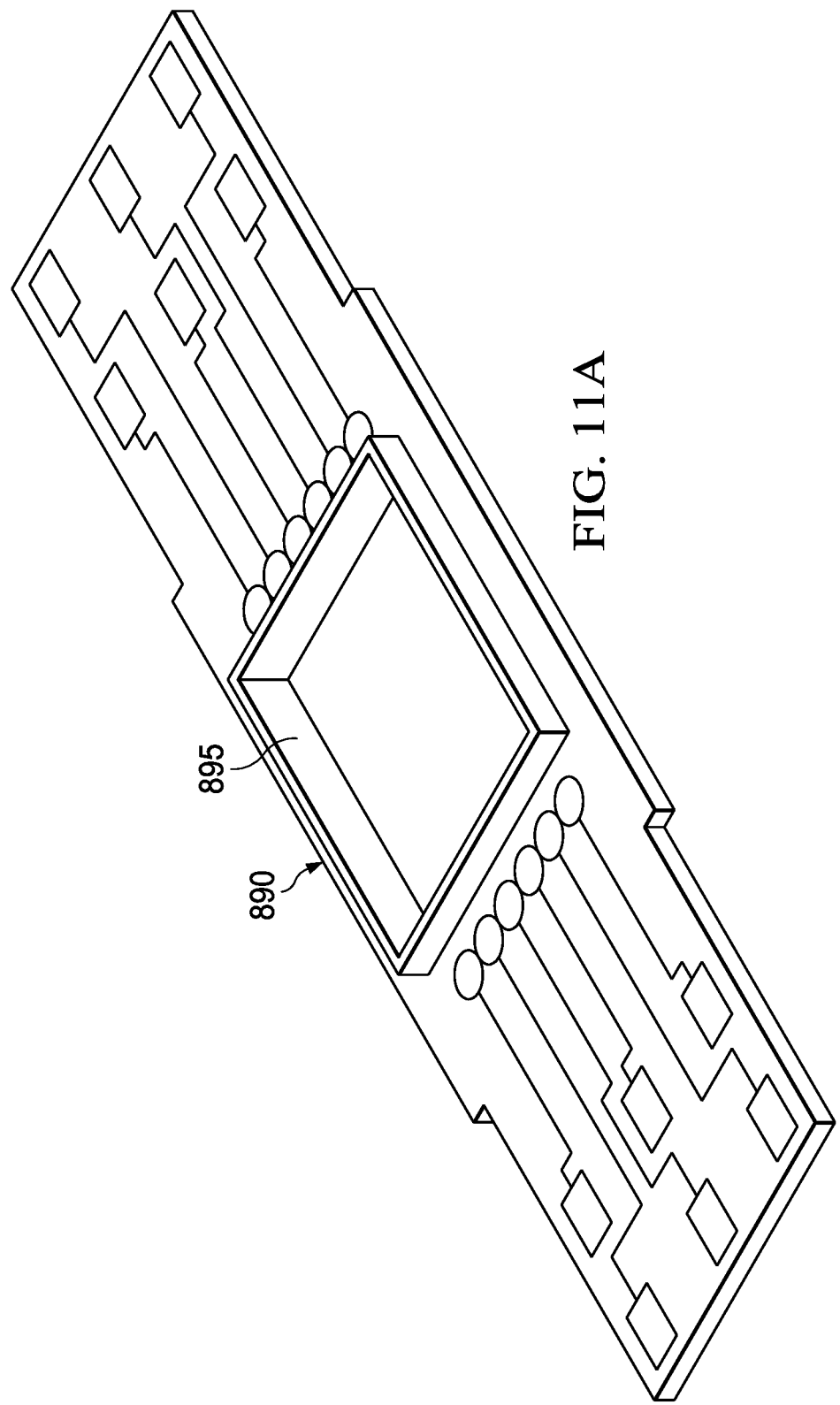
FIG. 11A shows a top side of an example flexible substrate for wrapping an optical MEMS die.

FIG. 11A shows a top side of an example flexible substrate 890 for wrapping an optical MEMS die 880, and FIG. 11B shows a bottom side view of the flexible substrate 890 shown in FIG. 11A. The flexible substrate 890 is designed to mechanically fit around the die stack including a heatsink or heat spreader. Electrically, the flexible substrate 890 is designed to fan-out connections from the optical MEMS die 880 to the package pins. An ACF, micro bumps, or Cu posts can be used for the interconnect, generally with a proper underfill. The flexible substrate 890 can comprise several different types of materials with multiple layers of insulators, adhesives, and electrically conductive layers that are inter-connected. The flexible substrate 890 provides die-interconnect, package, pins, redistribution, encapsulation, and moisture seal enhancement, all by itself.

Figure 12A:
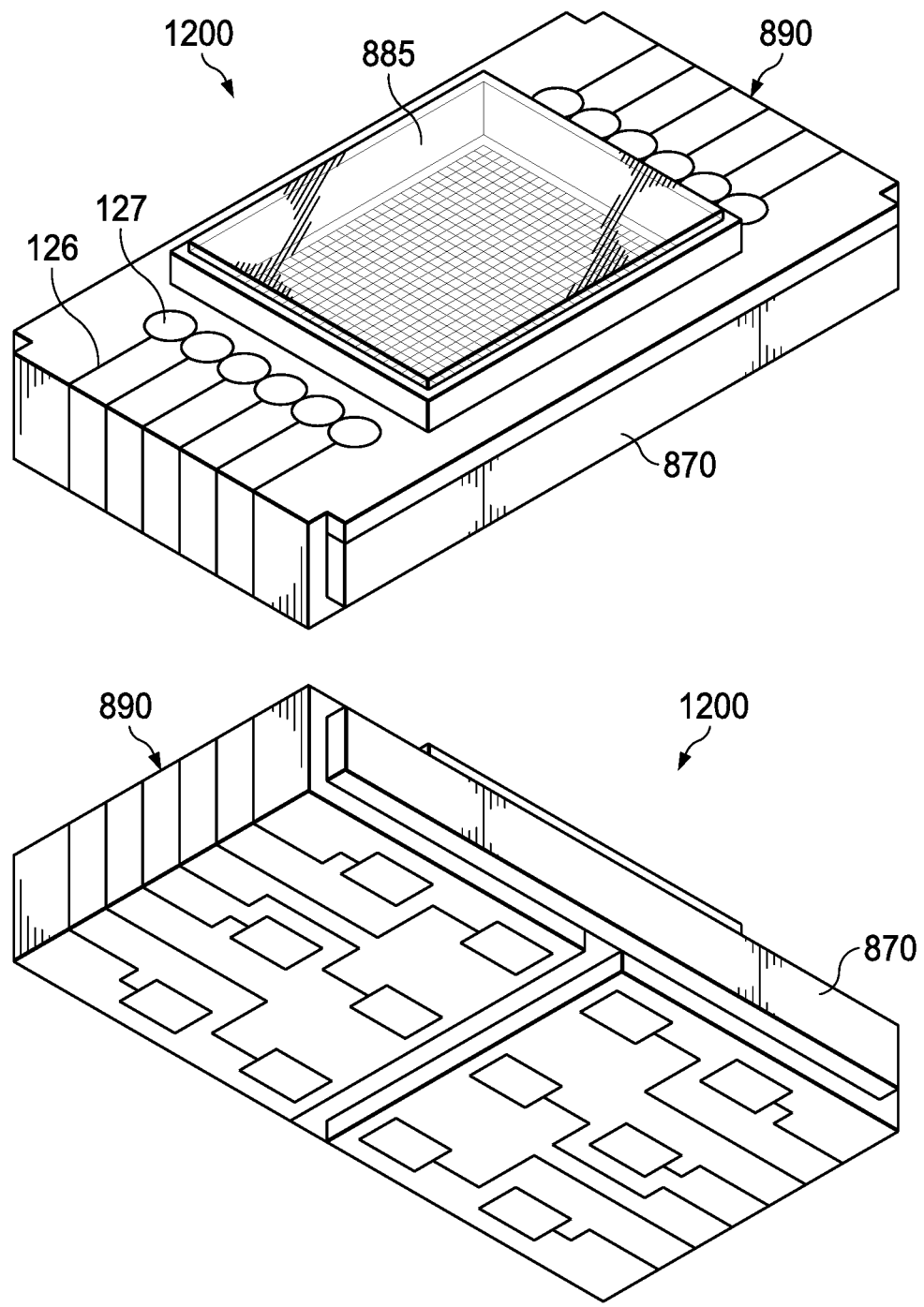
FIG. 12A shows a top perspective and a bottom perspective view an example wrapped optical MEMS device comprising and an example wrapped MEMS die (not visible but under the transparent window)
Figure 12B:
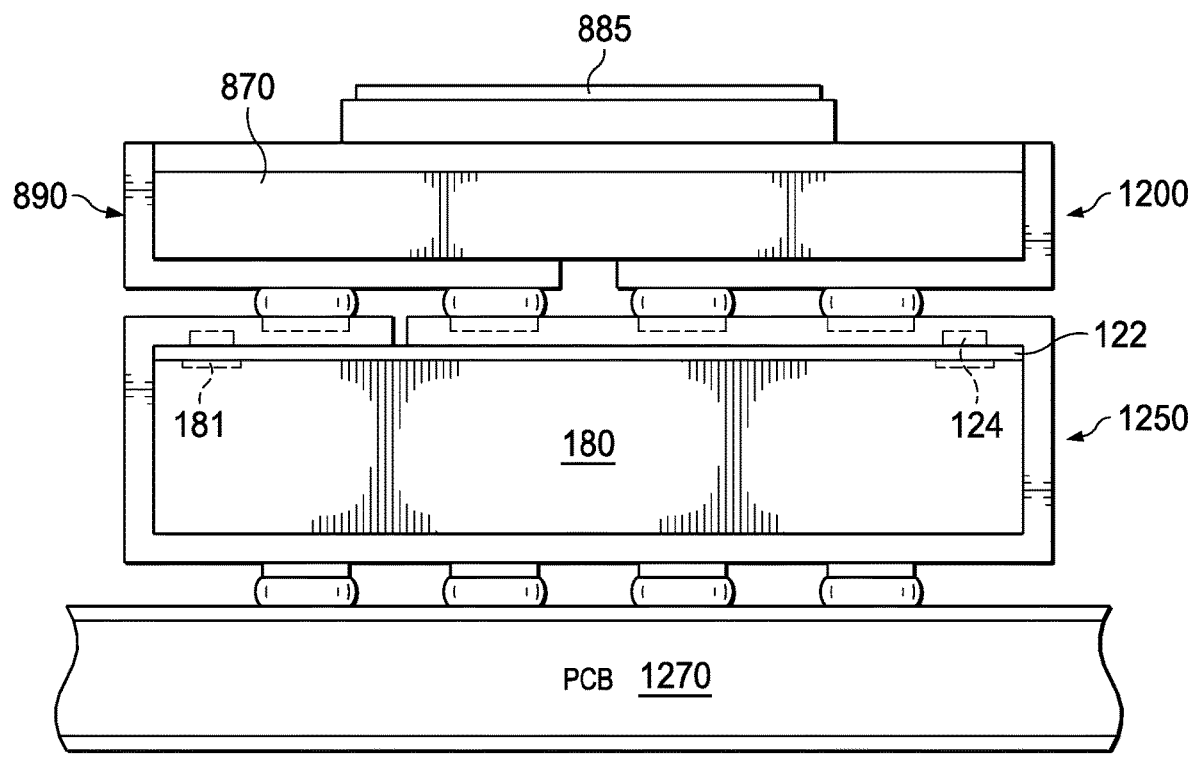
FIG. 12B shows a side view depiction after the stacking of the wrapped optical MEMS device, a die-wrapped packaged device all on another substrate shown as a PCB functioning as the mother board.

FIG. 12A shows a top perspective and a bottom perspective view an example wrapped optical MEMS device 1200 comprising and an example wrapped MEMS die (not visible in the view provided but is under the transparent window 885), and FIG. 12B is a side view depiction after the stacking of the wrapped optical MEMS device 1200, a die-wrapped packaged device shown as 1250 all on another substrate shown as a printed circuit board (PCB) 1270 functioning as a mother board. The complexity of the optical MEMS device 1200 can be reduced by decreasing the number of I/O connections. One way to reduce the I/O connections are by multiplexing (serializer/deserializer) signal pins. As these packages lend themselves into vertical integration, the die-wrapped packaged device 1250 such as a controller IC as described above can be vertically placed under the wrapped optical MEMS device 1200. This configuration will generally limit the high-speed signals to the package-to-package interconnects and eliminates the need for the motherboard to handle them. The PCB complexity and cost will generally remain low.

Figure 13B:
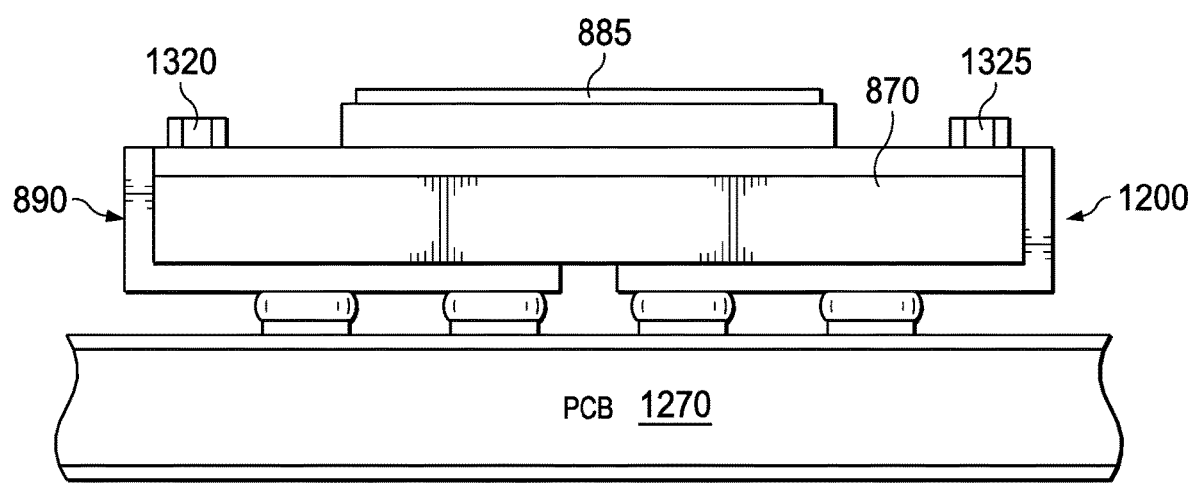
FIG. 13B shows the wrapped optical MEMS die in FIG. 13A mounted on another substrate shown as a PCB, where the package includes at least one additional component.
Figure 13A:
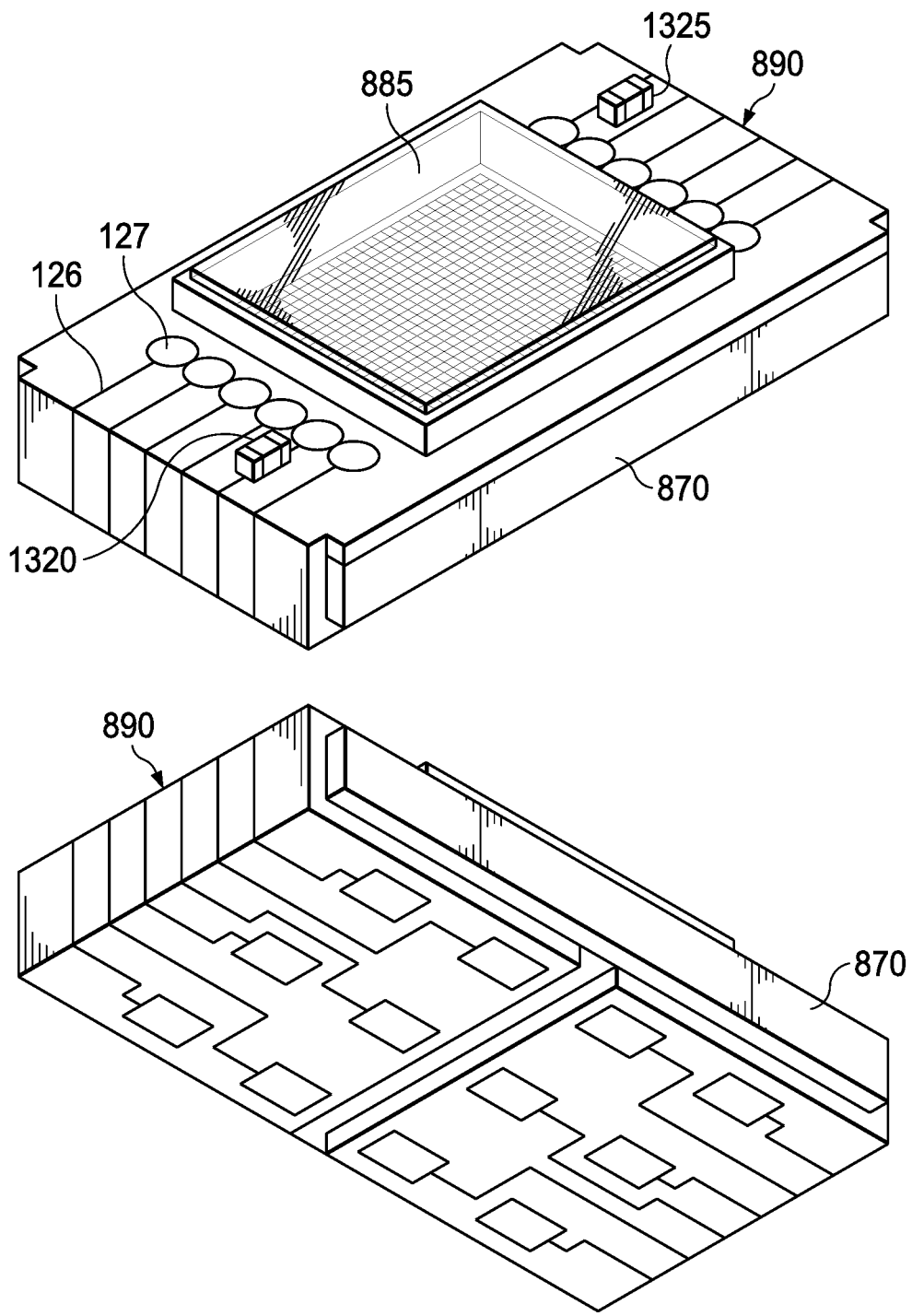
FIG. 13A shows a top side and a backside of an example wrapped optical MEMS die.

FIG. 13A shows a top side and a backside of an example wrapped optical MEMS die, and FIG. 13B shows the wrapped optical MEMS die in FIG. 13A mounted on another substrate shown as a PCB, where the package includes at least one additional component shown as additional components 1320 and 1325. The additional components 1320 and 1325 can comprise ICs, passives, sensors, cameras, to increase functional density.

Figure 14:
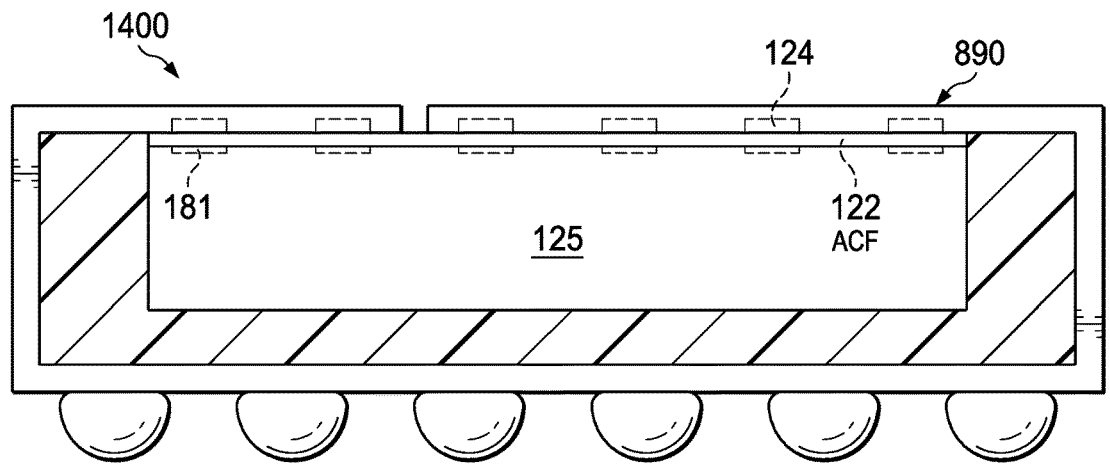
FIG. 14 shows an example MEMS package configured as a fan-out power WCSP that can solve the thermal and fan-out problems simultaneously for small die.

FIG. 14 shows an example MEMS package comprising a flexible substrate 890 having an ACF 122 with bonding features 124 (e.g. contact pads), thereon configured as a fan-out power WCSP 1400 that can solve the thermal and fan-out problems simultaneously for small size die with the die shown as 125 and its bond pads as 181. The wrapped MEMS package can be reconfigured as a fan-out WCSP for power and signal chain (non-MEMS) parts as well. The carrier can be made of a variety of materials to provide a choice of benefits. The carrier can be made of metal to provide rigid heat sink. The carrier can comprise Si to provide a reliable coefficient of thermal expansion (CTE) match with the die in the case of a silica die. The carrier can be made of polymers to provide cost advantages. Because the redistribution is prebuilt into the flexible substrate it is tolerant of discontinuities at the die-to-carrier edge. This arrangement can create BGA or LGA or QFN-type of foot prints, and can accommodate a wide variety of die sizes.

Figure 15A:
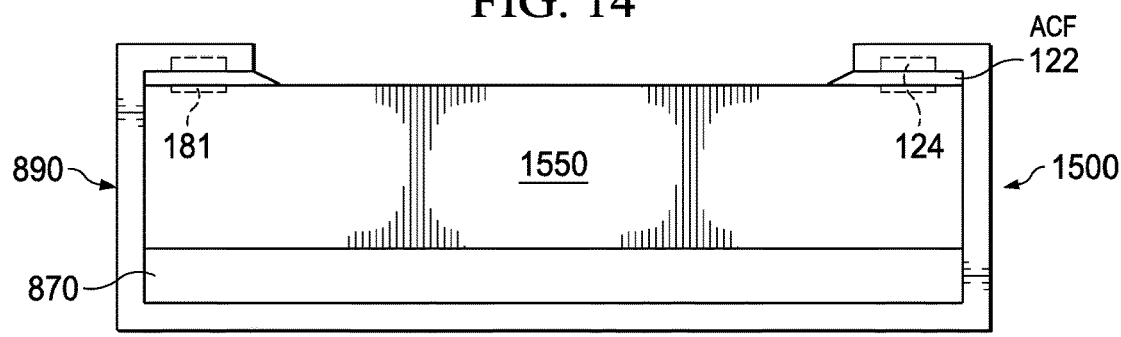
Figure 15B:
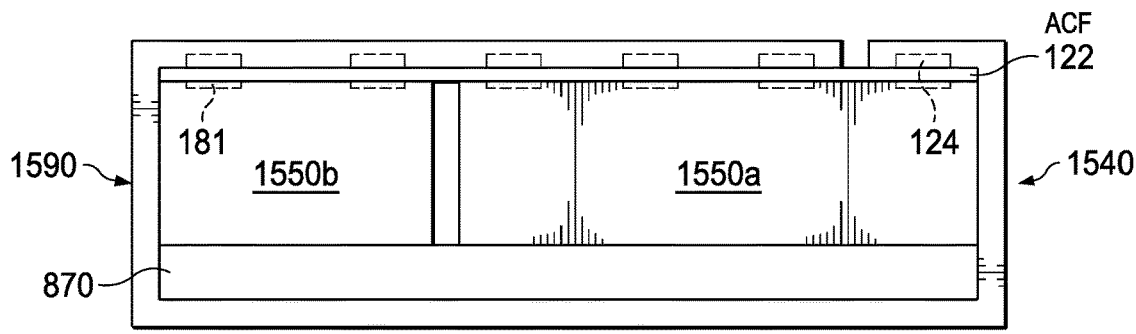
Figure 15C:
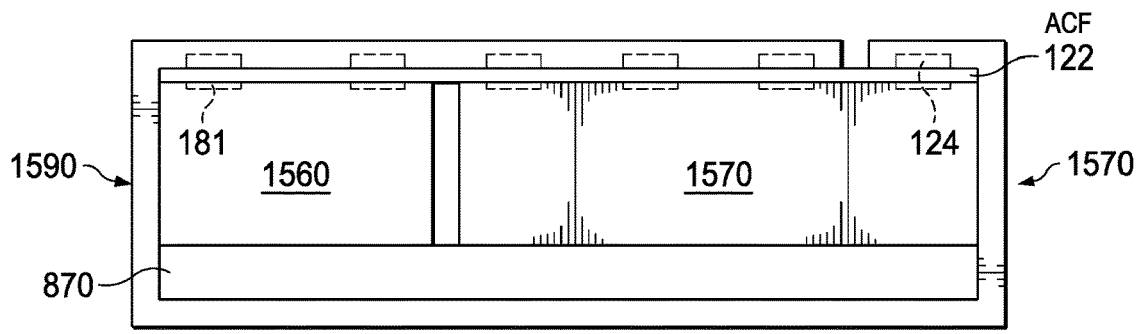
FIG. 15C shows the package shown in FIG. 15A modified to include passive devices.

FIG. 15A shows an example optical MEMS package comprising a flexible substrate 890 having an ACF 122 with bonding features 124 (e.g. contact pads), thereon extended to sensors such as humidity and pressure sensors by exposing a portion of the die shown as 1550 to the environment while still enabling interconnects and pinout, while FIG. 15B shows the package in FIG. 15A having multiple die to form a multichip module (MCM) shown as 1550a and 1550b with the flexible substrate now shown as 1590 and package now shown as 1540. FIG. 15C shows the package in FIG. 15A with the flexible substrate 1590 shown in FIG. 15B now shown as 1570 as it is modified to include integrated passives 1560 and 1570.

Disclosed aspects can be integrated into a variety of assembly flows to form a variety of different wrapped packaged devices and related products. The assembly can comprise single die or multiple die, such as PoP configurations comprising a plurality of stacked semiconductor die. The die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A die-wrapped packaged device, comprising:
   at least one flexible substrate having a top side and a bottom side that has lead terminals, wherein the top side has outer positioned die bonding features coupled by traces to through-vias that couple through a thickness of the flexible substrate to the lead terminals, and
   at least one die comprising a substrate having a back side and a topside semiconductor surface including circuitry thereon having nodes coupled to bond pads,
   wherein one of the sides of the die is mounted on the top side of the flexible circuit, and
   wherein the flexible substrate has a sufficient length relative to the die so that the flexible substrate wraps to extend over at least two sidewalls of the die onto the top side of the die and so that the die bonding features contact the bond pads.

2. The die-wrapped packaged device of claim 1, wherein the flexible substrate comprises a plurality of the flexible substrates each wrapped over at least one of the two sidewalls of the die.

3. The die-wrapped packaged device of claim 1, wherein the die bonding features comprise an anisotropic electrically conductive paste, copper pillars, an electrically conductive epoxy, or a metal polymer composite.

4. The die-wrapped packaged device of claim 1, wherein the flexible substrate comprises a polymer, a glass-reinforced epoxy laminate material, or a paper.

5. The die-wrapped packaged device of claim 1, wherein the die comprises two or more stacked die bonded to one another.

6. The die-wrapped packaged device of claim 1, wherein the die-wrapped packaged device comprises at least two of the die-wrapped packaged devices vertically stacked on one another.

7. The die-wrapped packaged device of claim 1, wherein the flexible substrate does not fully cover an area on the side of the die.

8. The die-wrapped packaged device of claim 1, wherein the die comprises a Micro-Electro-Mechanical System (MEMS) die.

9. The die-wrapped packaged device of claim 8, wherein the MEMS die comprises an optical MEMS die, further comprising a transparent window between the optical MEMS die and the top side of the flexible substrate.

10. The die-wrapped packaged device of claim 8, wherein the MEMS die comprises a sensor.

11. The die-wrapped packaged device of claim 1, wherein the die comprises multiple of the die positioned side-by-side.

12. A die-wrapped packaged device, comprising:
    a semiconductor die comprising a substrate having a back side and a top side semiconductor surface including circuitry thereon having nodes coupled to bond pads; and
    a glass-reinforced epoxy laminate material or paper flexible substrate having a sufficient length relative to the die so that the flexible substrate wraps to extend over at least two sidewalls of the die onto the top side of the die and bonding features on the flexible substrate contact the bond pads.

13. The die-wrapped packaged device of claim 12, wherein the die bonding features comprise an anisotropic electrically conductive paste, copper pillars, an electrically conductive epoxy, or a metal polymer composite.

14. The die-wrapped packaged device of claim 12, wherein the flexible substrate comprises a plurality of the flexible substrates each wrapped over at least one of the two sidewalls of the die.

15. The die-wrapped packaged device of claim 12, wherein the die comprises two or more stacked die bonded to one another.

16. The die-wrapped packaged device of claim 12, wherein the die-wrapped packaged device comprises at least two of the die-wrapped packaged devices vertically stacked on one another.

17. The die-wrapped packaged device of claim 12, wherein the flexible substrate does not fully cover an area on the side of the die.

18. The die-wrapped packaged device of claim 12, wherein the die comprises a Micro-Electro-Mechanical System (MEMS) die.

19. The die-wrapped packaged device of claim 18, wherein the MEMS die comprises an optical MEMS die, further comprising a transparent window between the optical MEMS die and the top side of the flexible substrate.

20. The die-wrapped packaged device of claim 18, wherein the MEMS die comprises a sensor.

21. The die-wrapped packaged device of claim 14, wherein the die comprises multiple of the die positioned side-by-side.

22. The die-wrapped packaged device of claim 1, further including at least one passive device attached to the flexible circuit.

23. The die-wrapped packaged device of claim 12, further including at least one passive device attached to the flexible circuit.

* * * * *